(12) United States Patent
Moon et al.

(10) Patent No.: US 12,720,982 B2
(45) Date of Patent: Aug. 25, 2026

(54) DISPLAY DEVICE AND METHOD FOR MANUFACTURING THE SAME

(71) Applicant: Samsung Display Co., Ltd., Yongin-Si (KR)

(72) Inventors: Sunggwon Moon, Yongin-si (KR); Donghan Kang, Yongin-si (KR); Jeehoon Kim, Yongin-si (KR); Seungsok Son, Yongin-si (KR); Shinhyuk Yang, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 361 days.

(21) Appl. No.: 18/542,783

(22) Filed: Dec. 18, 2023

(65) Prior Publication Data

US 2024/0224669 A1 Jul. 4, 2024

(30) Foreign Application Priority Data

Jan. 3, 2023 (KR) ........................ 10-2023-0000931

(51) Int. Cl.
*H10K 59/131* (2023.01)
*H10K 59/12* (2023.01)
*H10K 59/122* (2023.01)

(52) U.S. Cl.
CPC ....... *H10K 59/131* (2023.02); *H10K 59/1201* (2023.02); *H10K 59/122* (2023.02)

(58) Field of Classification Search
None
See application file for complete search history.

(56) References Cited

U.S. PATENT DOCUMENTS 10,403,845 B2 9/2019 Lee et al.
2013/0009162 A1* 1/2013 Kang .................. H10K 59/122 257/E51.005
2019/0189717 A1 6/2019 Choi et al.
2021/0343811 A1 11/2021 Kim et al.
(Continued)

FOREIGN PATENT DOCUMENTS

CN 113871430 A 12/2021
KR 10-2018-0077767 A 7/2018
KR 10-2019-0074545 A 6/2019
(Continued)

*Primary Examiner* — Kyoung Lee
(74) *Attorney, Agent, or Firm* — Innovation Counsel LLP

(57) ABSTRACT

A display device is disclosed that includes an auxiliary power line, a first inorganic insulating layer, a second inorganic insulating layer, a pixel defining layer, and a common electrode. The auxiliary power line is disposed in a display area on a substrate. The first inorganic insulating layer is disposed on the auxiliary power line and defines a first opening extending to at least part of an upper surface of the auxiliary power line. The second inorganic insulating layer is disposed on the first inorganic insulating layer and defines a second opening connected to the first opening. The pixel defining layer is disposed on the second inorganic insulating layer and defines a pixel contact hole connected to the first and second openings. An end of the pixel defining layer includes a protrusion protruding toward a center of the pixel contact hole. The common electrode disposed on the pixel defining layer and electrically connected to the auxiliary power line.

20 Claims, 23 Drawing Sheets

(56) References Cited

U.S. PATENT DOCUMENTS

| | | | |
|---|---|---|---|
| 2022/0102471 | A1 | 3/2022 | Jang et al. |
| 2024/0251635 | A1 | 7/2024 | Tang |

FOREIGN PATENT DOCUMENTS

| | | | |
|---|---|---|---|
| KR | 10-2178471 | B1 | 11/2020 |
| KR | 10-2021-0086869 | A | 7/2021 |
| KR | 10-2305495 | B1 | 9/2021 |
| KR | 10-2021-0135386 | A | 11/2021 |
| KR | 10-2022-0042815 | A | 4/2022 |
| KR | 10-2022-0069361 | A | 5/2022 |
| KR | 10-2427712 | B1 | 7/2022 |

* cited by examiner

FIG. 4

IL { ILD PVX
PVX'
ILD'
BUF
SUB
CNT2 CNT1
PE
GI
PA
OP2-A OP1-A
VL
CL1 CL2
AL
GI
CP
DA
CNT3
VCNT
PXE
BML
CE1
GAT
ACT
CE2
TR
VIA
GI
PVX'
ILD'
BUF
SUB

PDL-A
VIA
GI
PVX'
ILD'
BUF
SUB
VCNT
CNT3
CE2
ACT
GAT
CE1
BML
TR
CP
GI
CL1
CL2
AL
VL
OP2-A
OP1-A
DA
IL
ILD
PVX
CNT2
CNT1
PE
PA

IL { ILD PVX
PI
PVX'
ILD'
BUF
SUB
CNT2
CNT1
PE
GI
PA
PCNT
OP1-A
OP2-A
VL
CL2
CL1
AL
GI
CP
DA
CNT3
BML
CE1
VCNT
POP
GAT
ACT
CE2
TR
PXE
PDL
VIA
GI
PVX'
ILD'
BUF
SUB

CME
EL
PXE
PDL
LED
VIA
GI
PVX
ILD
BUF
SUB
I
POP
VCNT
CNT3
CE2
ACT
GAT
CE1
BML
TR
CP
GI
CL1
CL2
AL
VL
DA
GV
PCNT
OP2
OP1
E
CME
EL
PP
UC
IL
ILD
PVX
CNT2
CNT1
EL
PI
PVX
ILD
BUF
SUB
PE
GI
PA

Figure 22:
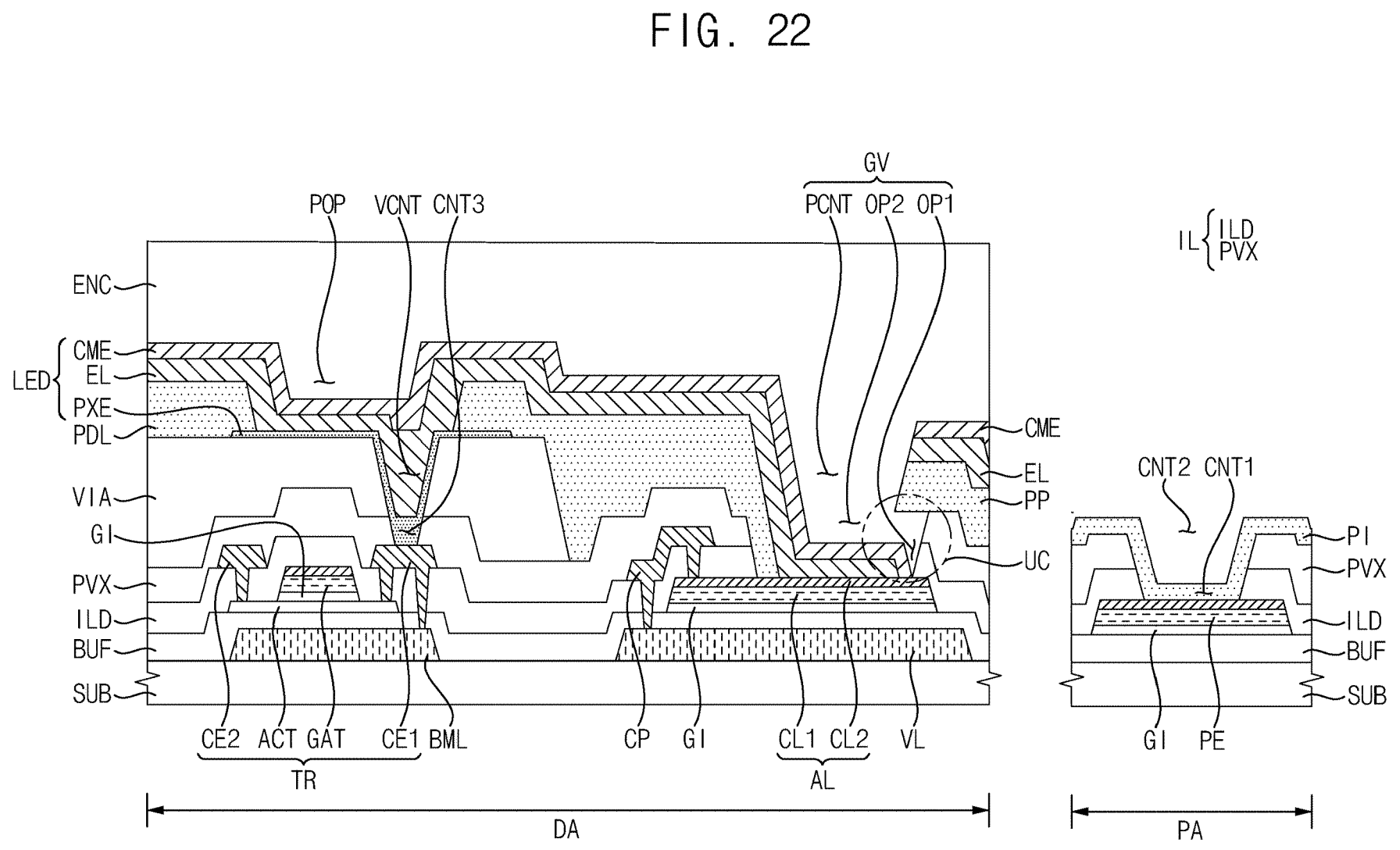

ENC
CME EL PXE PDL LED
VIA
GI
PVX
ILD
BUF
SUB
POP
VCNT CNT3
CE2 ACT GAT CE1 BML TR
GI
CP
GI
CL1 CL2 AL
VL
DA
PCNT OP2 OP1 GV
UC
CME EL PP
IL ILD PVX
CNT2 CNT1
PI PVX ILD BUF SUB
PE GI
PA

DISPLAY DEVICE AND METHOD FOR MANUFACTURING THE SAME

CROSS-REFERENCE TO RELATED APPLICATION

This application claims priority to and benefits of Korean Patent Application No. 10-2023-0000931 under 35 U.S.C. § 119, filed on Jan. 3, 2023 in the Korean Intellectual Property Office (KIPO), the entire contents of which are hereby incorporated by reference.

BACKGROUND

1. Field

The present disclosure relates to a display device. More particularly, the present disclosure relates to a display device that provides visual information and a method for manufacturing the same.

2. Description of the Related Art

With the development of information technology, the importance of a display device, which is a connection medium between a user and information, has increased. For example, the use of a display device such as a liquid crystal display device ("LCD"), an organic light emitting display device ("OLED"), a plasma display device ("PDP"), a quantum dot display device, and the like is increasing.

Meanwhile, a display device includes a plurality of light emitting elements, and the plurality of light emitting elements share a common electrode. As the size of the display device increases, the quality of images produced by the display device may deteriorate due to a drop in voltage across the common electrode.

SUMMARY

Embodiments may provide a display device with improved display quality.

Embodiments may provide a method for manufacturing the display device.

A display device according to an embodiment of the present discourse includes an auxiliary power line disposed in a display area on a substrate, a first inorganic insulating layer disposed on the auxiliary power line and defining a first opening extending to at least part of an upper surface of the auxiliary power line, a second inorganic insulating layer disposed on the first inorganic insulating layer and defining a second opening connected to the first opening, a pixel defining layer disposed on the second inorganic insulating layer, defining a pixel contact hole connected to the first and second openings, an end of the pixel defining layer including a protrusion protruding toward a center of the pixel contact hole, and a common electrode disposed on the pixel defining layer and electrically connected to the auxiliary power line.

In an embodiment, the protrusion may define an undercut shape together with first sides of the first and second openings, and the pixel defining layer may extend into the first and second openings to cover second side surfaces of the first and second openings facing the first side surfaces.

In an embodiment, the display device may further include a light emitting layer disposed on the pixel defining layer and the auxiliary power line. The light emitting layer may be disconnected by the protrusion.

In an embodiment, a sum of a thickness of the first inorganic insulating layer and a thickness of the second inorganic insulating layer may be greater than or equal to a thickness of the light emitting layer.

In an embodiment, the display device may further include a transistor disposed in the display area on the substrate and including: an active pattern disposed in the display area on the substrate, a gate electrode disposed on the active pattern, a first electrode disposed connected to the active pattern, and a second electrode disposed connected to the active pattern and disposed in a same layer with the first electrode and a pad electrode disposed in a pad area positioned in one side of the display area.

In an embodiment, the auxiliary power line may include a same material as the pad electrode.

In an embodiment, the auxiliary power line and the pad electrode may include a same material as the gate electrode.

In an embodiment, the first and second inorganic insulating layers may include a same silicon compound.

In an embodiment, the first and second inorganic insulating layers may include different silicon compound.

In an embodiment, the auxiliary power line may include a first conductive layer and a second conductive layer disposed on the first conductive layer. The first conductive layer may include at least one material selected from a group consisting of titanium (Ti), copper (Cu), and aluminum (Al) and the second conductive layer may include a transparent conductive material. In an embodiment, the pixel defining layer may include an organic material.

In an embodiment, a first inclination angle formed between a first side surface of the first opening and an upper surface of the auxiliary power line may be different from a second inclination angle formed between a first side surface of the second opening and the power surface of the auxiliary power line.

In an embodiment, the second inclination angle may be greater than the first second inclination angle.

In an embodiment, a length of the protrusion toward the center of the pixel contact hole may be about 0.1 micrometers (um) to about 0.5 micrometers (um).

In an embodiment, the common electrode may directly contact at least part of an upper surface of the auxiliary power line.

A method for manufacturing a display device according to an embodiment of the present disclosure includes forming an auxiliary power line in a display on a substrate, forming a first preliminary inorganic insulating layer on the auxiliary power line, forming a second preliminary inorganic insulating layer on the first preliminary inorganic insulating layer, simultaneously forming a first inorganic insulating layer defining a first preliminary opening exposing at least a part of an upper surface of the auxiliary power line and a second inorganic insulating layer defining a second preliminary opening connected to the first preliminary opening by removing parts of the first and second preliminary inorganic insulating layers in the display area, forming a pixel defining layer defining a pixel contact hole connected to the first and second preliminary openings on the second inorganic insulating layer, removing parts of the first and second inorganic insulating layers overlapping the auxiliary power line and the pixel defining layer and exposed from the pixel defining layer so that an end of the pixel defining layer includes a protrusion protruding toward a center of the pixel contact hole, and forming a common electrode electrically connected to the auxiliary power line on the pixel defining layer.

In an embodiment, in the removing of the parts of the first and second inorganic insulating layers, the parts of the first and second inorganic insulating layers may be removed through a wet etching process.

In an embodiment, the first preliminary opening may be expanded to form a first opening, the second preliminary opening may be expanded to form a second opening, and the protrusion may form an undercut shape together with first side surfaces of the first and second openings after the removing the parts of the first and second inorganic insulating layers.

In an embodiment, the method may further include forming a pad electrode in a pad area positioned in one side of the display area on the substrate. The auxiliary power line may be simultaneously formed through a same process as the pad electrode.

In an embodiment, the forming the pixel defining layer may include forming a preliminary pixel defining layer on the second inorganic insulating layer to fill the first and second preliminary openings, simultaneously forming the pixel defining layer in the display area and a protective insulating layer in contact with the pad electrode in the pad area by selectively exposing and developing the preliminary pixel defining layer through a halftone mask, and removing the protective insulating layer after the forming the common electrode.

A display device according to an embodiment of the present disclosure includes a first inorganic insulating layer defining a first opening extending to at least a part of an upper surface of an auxiliary power line to which a common voltage is applied, a second inorganic insulating layer disposed on the first inorganic insulating layer defining a second opening connected to the first opening, a pixel defining layer disposed on the second inorganic insulating layer, defining a pixel contact hole connected to the first and second openings, an end of the pixel defining layer including a protrusion protruding toward a center of the pixel contact hole, and a common electrode disposed on the pixel defining layer and electrically connected to the auxiliary power line. In this case, the protrusion may define an undercut shape together with side surfaces of the first and second openings exposed from the pixel defining layer. Defects caused by the common electrode not being electrically connected to the auxiliary power line may be improved.

BRIEF DESCRIPTION OF THE DRAWINGS

Illustrative, non-limiting embodiments will be more clearly understood from the following detailed description in conjunction with the accompanying drawings.

FIG. 4 is a cross-sectional view taken along line I-I' of FIG. 1.

FIGS. 7, 8, 9, 10, 11, 12, 13, 14, 15, 16, 17, 18, 19, 20, 21, and 22 are cross-sectional views for explaining a method for manufacturing the display device of FIG. 4.

DETAILED DESCRIPTION OF THE EMBODIMENTS

Figure 1:
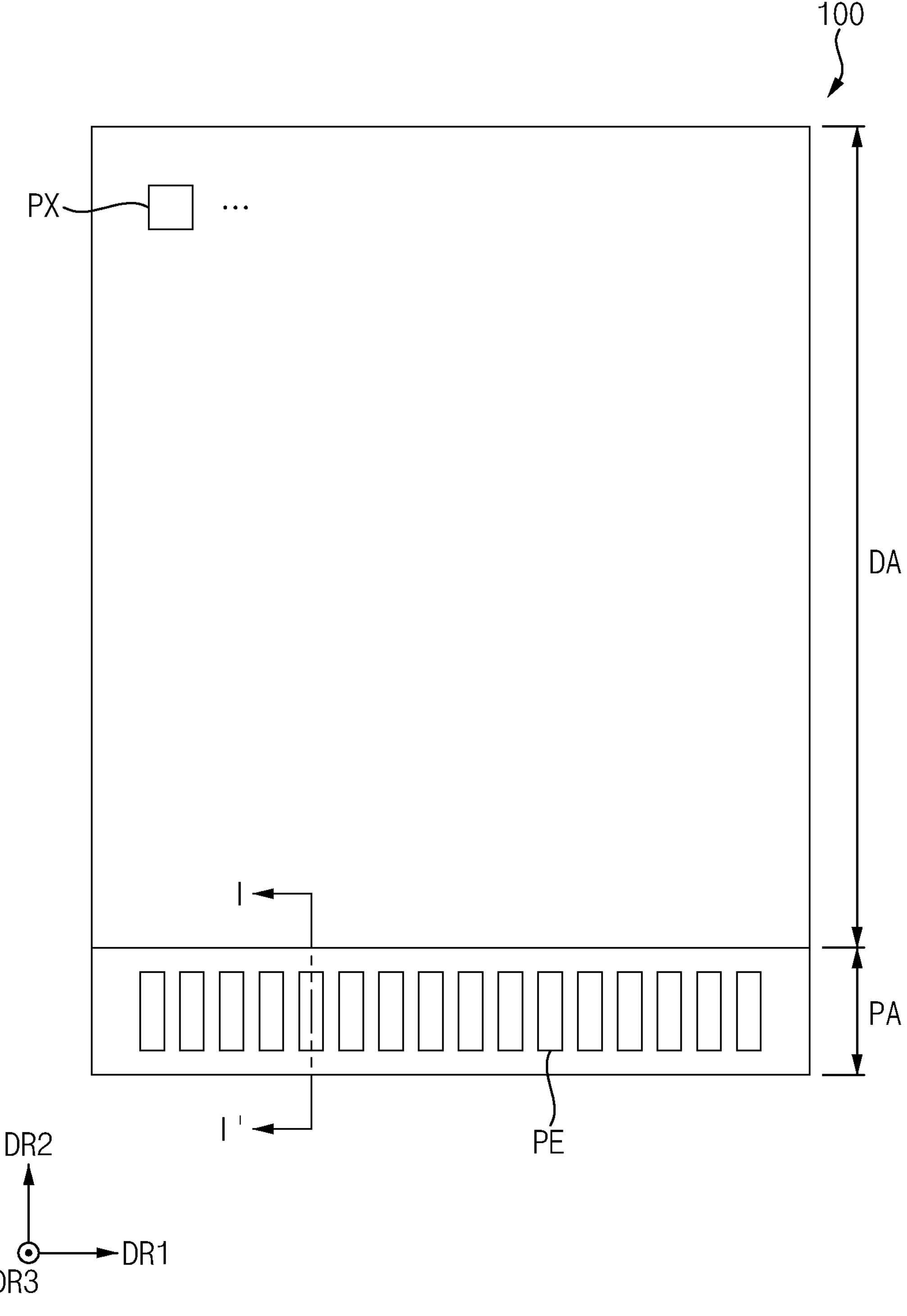
FIG. 1 is a plan view illustrating a display device according to an embodiment of the present disclosure.

Hereinafter, a display device according to embodiments of the present disclosure will be explained in detail with reference to the accompanying drawings. The same reference numerals are used for the same components in the drawings, and redundant descriptions of the same components will be omitted.

FIG. 1 is a plan view illustrating a display device according to an embodiment of the present disclosure.

Referring to FIG. 1, a display device 100 according to an embodiment may include a display area DA and a pad area PA. The display area DA may be an area capable of displaying an image by generating light or adjusting transmittance of light provided from an external light source.

The plurality of pixels PX may be disposed in the display area DA. For example, the plurality of pixels PX may be arranged in a matrix form along a first direction DR1 and a second direction DR2 crossing the first direction DR1.

Each of the plurality of pixels PX may include a light emitting element that generates light and a transistor that drives the light emitting element. For example, the light emitting device may include an organic light emitting diode. Alternatively, the light emitting element may include a nano light emitting diode. Meanwhile, the transistor may be a thin film transistor (TFT). An image may be displayed on the display area DA of the display device 100 through the plurality of pixels PX including the light emitting element and the transistor.

The pad area PA may be positioned on at least one side of the display area DA. For example, the pad area PA may be positioned below the display area DA. A plurality of pad electrodes PE may be disposed in the pad area PA. The plurality of pad electrodes PE may be spaced apart from each other along the first direction DR1. The plurality of pad electrodes PE may be electrically connected to an external device. That is, the plurality of pad electrodes PE may electrically connect the external device and the plurality of pixels PX. For example, each of the plurality of pad electrodes PE may include a metal, an alloy, a metal nitride, a conductive metal oxide, a transparent conductive material, or the like. These may be used alone or in combination with each other.

The external device may be electrically connected to the display device 100 through a circuit board. For example, the circuit board may include a printed circuit board (PCB) or a flexible printed circuit board (FPCB). One side of the circuit board may directly contact the plurality of pad electrodes PE, and the other side of the circuit board may directly contact the external device. The external device may provide a data signal, a gate signal, an emission control signal, an initialization voltage, a power supply voltage, and the like to the display device 100. In addition, a driving integrated circuit (IC) may be mounted on the circuit board. Alternatively, the driving integrated circuit may be mounted on the display device 100.

FIG. 1 illustrates that a width of the pad area PA in the first direction DR1 is the same as a width of the display area DA in the first direction DR1, but the present disclosure is not limited thereto. For example, the width of the pad area PA in the first direction DR1 may be smaller than the width of the display area DA in the first direction DR1.

The display device 100 may have a rectangular planar shape. However, the present disclosure is not limited thereto, and the display device 100 may have various planar shapes (e.g., a rectangular planar shape with rounded corners).

In this specification, a plane may be defined as the first direction DR1 and the second direction DR2 crossing the first direction DR1. For example, the first direction DR1 may be perpendicular to the second direction DR2. In addition, a third direction DR3 may be perpendicular to the plane.

Figure 2:
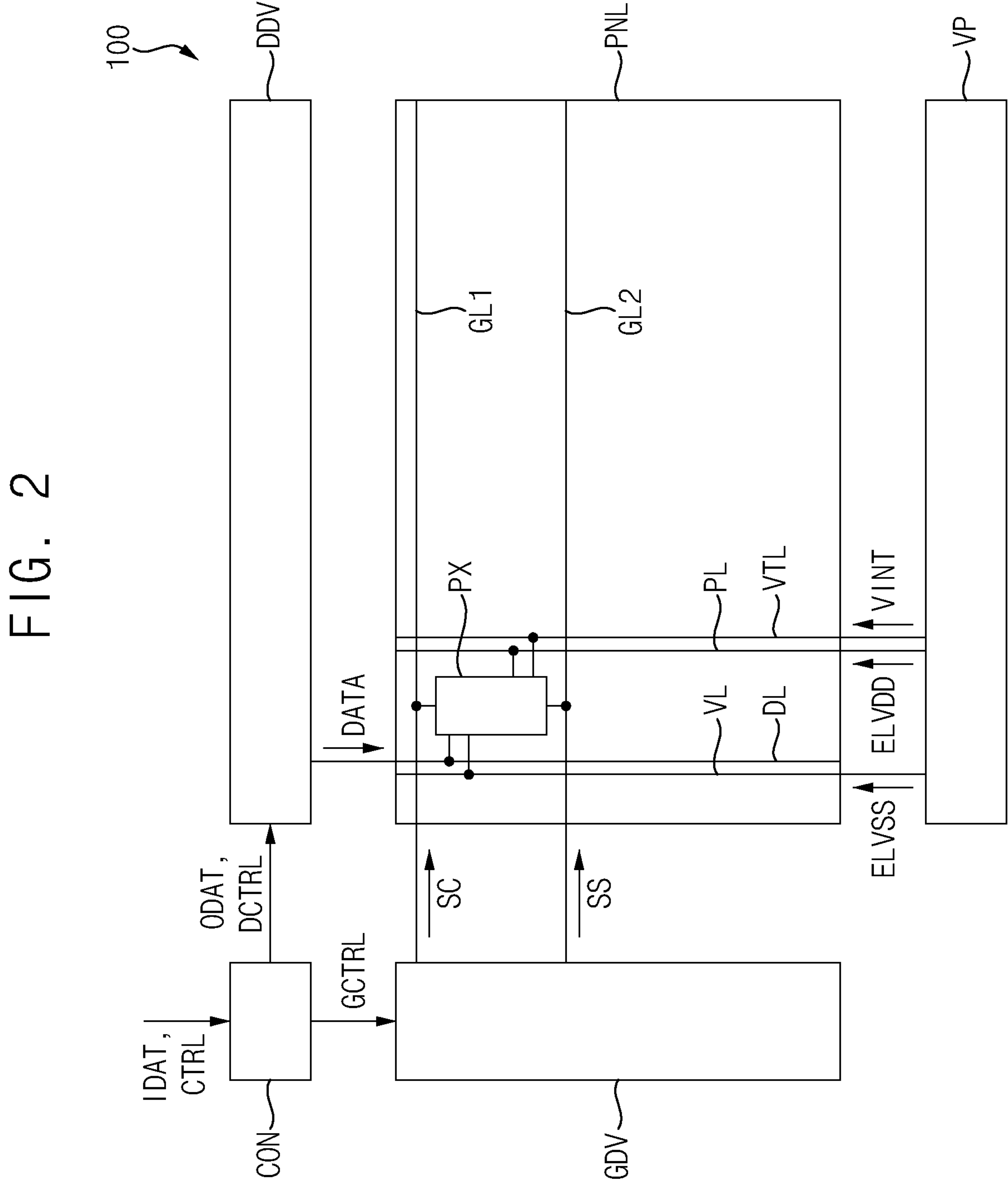
FIG. 2 is a block view schematically illustrating the display device of FIG. 1.

FIG. 2 is a block view schematically illustrating the display device of FIG. 1.

Referring to FIG. 2, the display device 100 according to an embodiment of the present disclosure may include a display panel PNL, a data driver DDV, a gate driver GDV, a controller CON, and a voltage supplier VP.

The display panel PNL may include the plurality of pixels PX.

The pixel PX may receive a first gate signal SC through a first gate line GL1 and receive a second gate signal SS through a second gate line GL2. In addition, the pixel PX may receive a data voltage DATA through a data line DL and receive an initialization voltage VINT through an initialization voltage line VTL. The data voltage DATA may be written to the pixel PX in response to the first gate signal SC, and the initialization voltage VINT may be written to the pixel PX in response to the second gate signal SS.

The data driver DDV may generate the data voltage DATA based on an output image data ODAT and a data control signal DCTRL. For example, the data driver DDV may generate the data voltage DATA corresponding to the output image data ODAT and output the data voltage DATA in response to the data control signal DCTRL. For example, the data control signal DCTRL may include an output data enable signal, a horizontal start signal, a load signal, and the like.

The gate driver GDV may generate the first and second gate signals SC and SS based on a gate control signal GCTRL. For example, each of the first and second gate signals SC and SS may include a gate-on voltage for turning on the transistor and a gate-off voltage for turning off the transistor. For example, the gate control signal GCTRL may include a vertical start signal, a clock signal, and the like.

The controller CON may receive the input image data IDAT and the control signal CTRL from an external host process (e.g., GPU). For example, the input image data IDAT may be RGB data including red image data, green image data, and blue image data. The control signal CTRL may include a vertical synchronization signal, a horizontal synchronization signal, an input data enable signal, a master clock signal, and the like. The controller CON may generate the gate control signal GCTRL, the data control signal DCTRL, and the output image data ODAT based on the input image data IDAT and the control signal CTRL.

The voltage suppler VP may provide a driving voltage ELVDD, a common voltage ELVSS, and the initialization voltage VINT to the pixel PX. The driving voltage ELVDD may be provided to the pixel PX through a driving line PL. The common voltage ELVSS may be provided to the pixel PX through a power line VL and a common electrode (e.g., a common electrode CME of FIG. 4). In other words, the power line VL may transmit the common voltage ELVSS to the common electrode CME.

Figure 3:
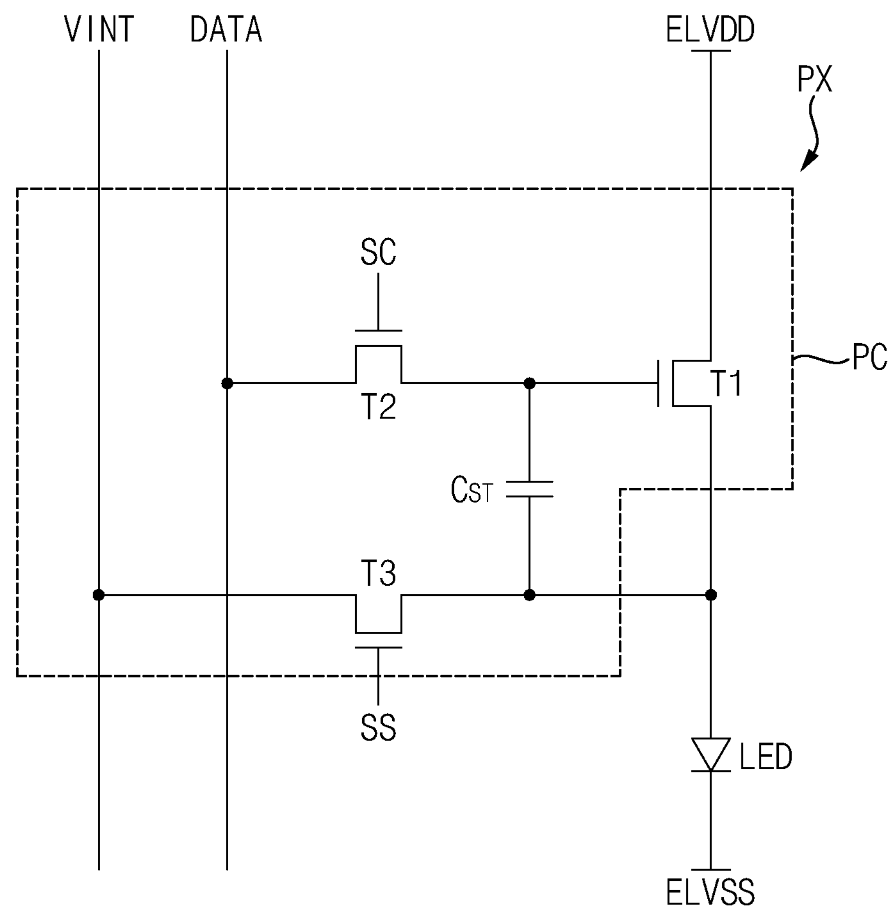
FIG. 3 is a circuit view for explaining a pixel included in the display device of FIG. 1.

FIG. 3 is a circuit view for explaining a pixel included in the display device of FIG. 1.

Referring to FIG. 3, the pixel PX may include a pixel circuit PC and a light emitting device LED. The pixel circuit PC may include a first transistor T1, a second transistor T2, a third transistor T3, and a storage capacitor $C_{ST}$. The pixel circuit PC may be electrically connected to the light emitting element LED.

The first transistor T1 may include a first terminal, a second terminal, and a gate terminal. The first terminal of the first transistor T1 may receive the driving voltage ELVDD. The second terminal of the first transistor T1 may be connected to the light emitting element LED. The gate terminal of the first transistor T1 may be connected to the second transistor T2. The first transistor T1 may generate a driving current based on the driving voltage ELVDD and the data voltage DATA.

The second transistor T2 may include a first terminal, a second terminal, and a gate terminal. The first terminal of the second transistor T2 may receive the data voltage DATA. The second terminal of the second transistor T2 may be connected to the first transistor T1. The gate terminal of the second transistor T2 may receive the first gate signal SC. The second transistor T2 may transmit the data voltage DATA in response to the first gate signal SC.

The third transistor T3 may include a first terminal, a second terminal, and a gate terminal. The first terminal of the third transistor T3 may be connected to the first transistor T1. The second terminal of the third transistor T3 may receive the initialization voltage VINT. The gate terminal of the third transistor T3 may receive the second gate signal SS. The third transistor T3 may transmit the initialization voltage VINT in response to the second gate signal SS.

The storage capacitor $C_{ST}$ may include a first terminal and a second terminal. The first terminal of the storage capacitor $C_{ST}$ may be connected to the gate terminal of the first transistor T1. The second terminal of the storage capacitor $C_{ST}$ may be connected to the first terminal of the third transistor T3. The storage capacitor $C_{ST}$ may maintain a voltage level of the gate terminal of the first transistor T1 during an inactive period of the first gate signal SC.

The light emitting element LED may include a first terminal and a second terminal. The first terminal of the light emitting element LED may be connected to the second terminal of the first transistor T1. The second terminal of the light emitting element LED may receive the common voltage ELVSS. The light emitting element LED may emit light having luminance corresponding to the driving current. The light emitting element LED may be an organic light emitting element using an organic material as a light emitting layer, an inorganic light emitting element using an inorganic material as a light emitting layer, or the like.

In FIG. 3, the pixel circuit PC includes three transistors and one capacitor, but the present disclosure is not limited thereto. For example, the pixel circuit PC may include various numbers of transistors and various numbers of capacitors.

Figure 4:
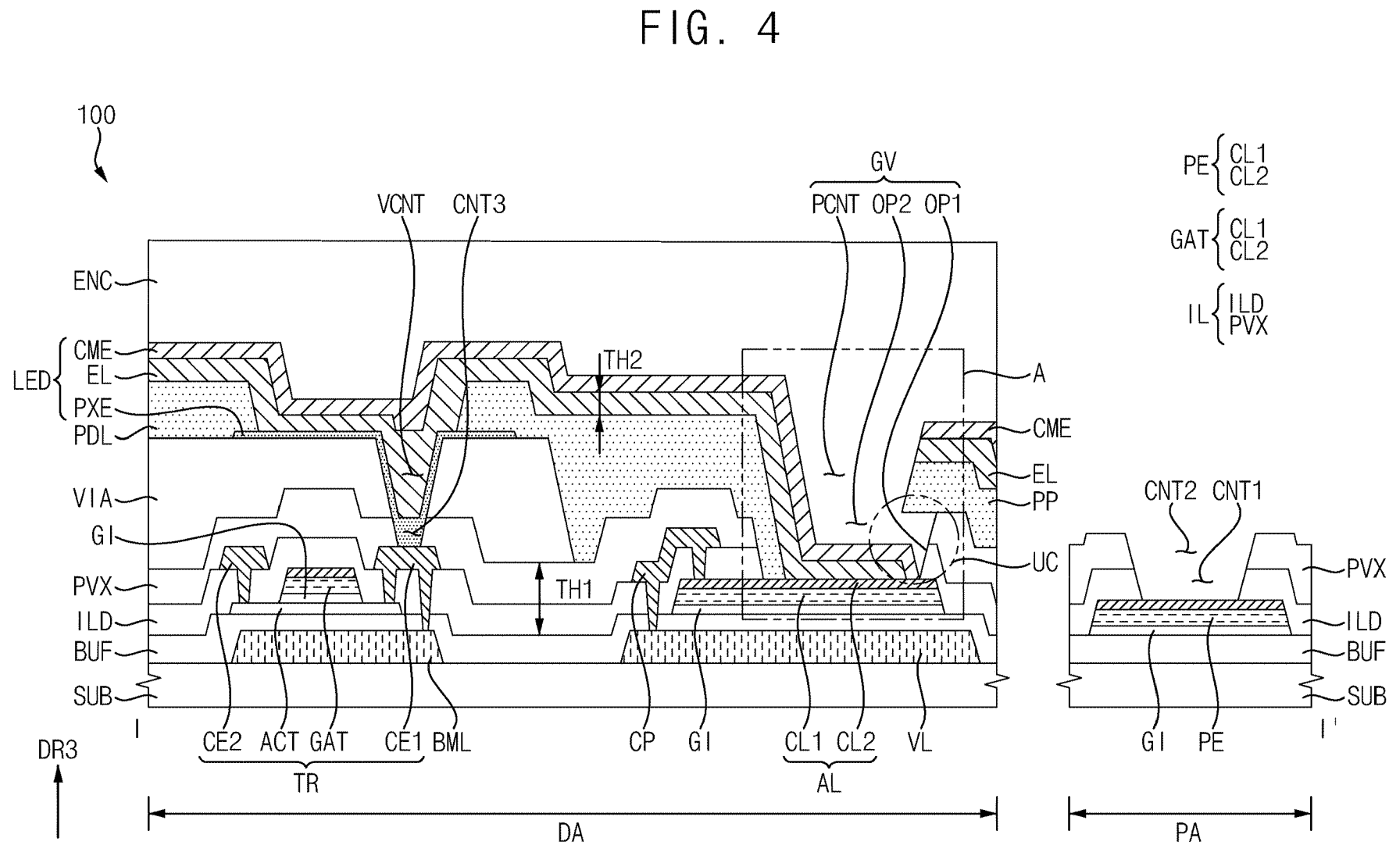
Figure 5:
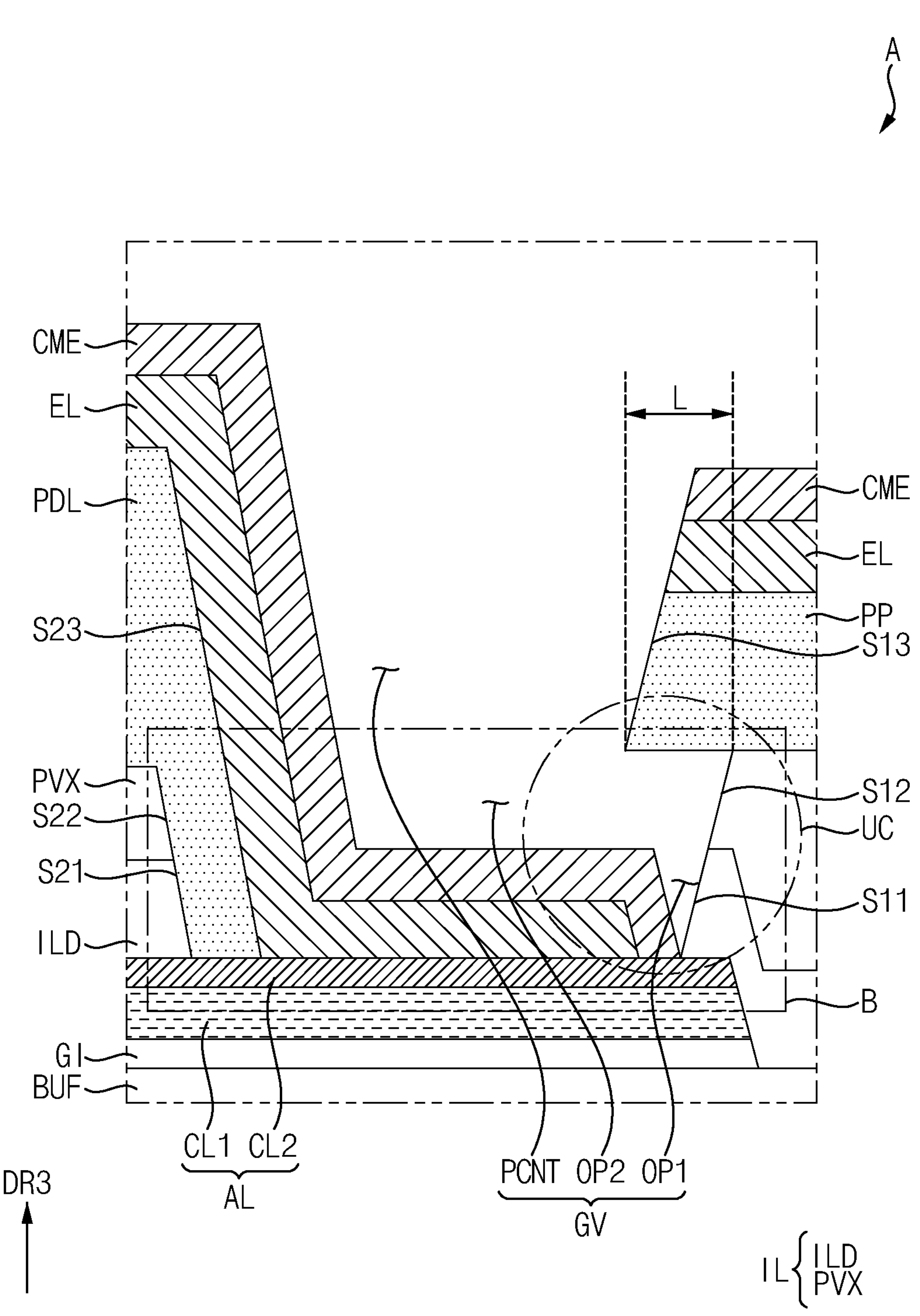
FIG. 5 is an enlarged cross-sectional view of area A of FIG. 4.
Figure 6:
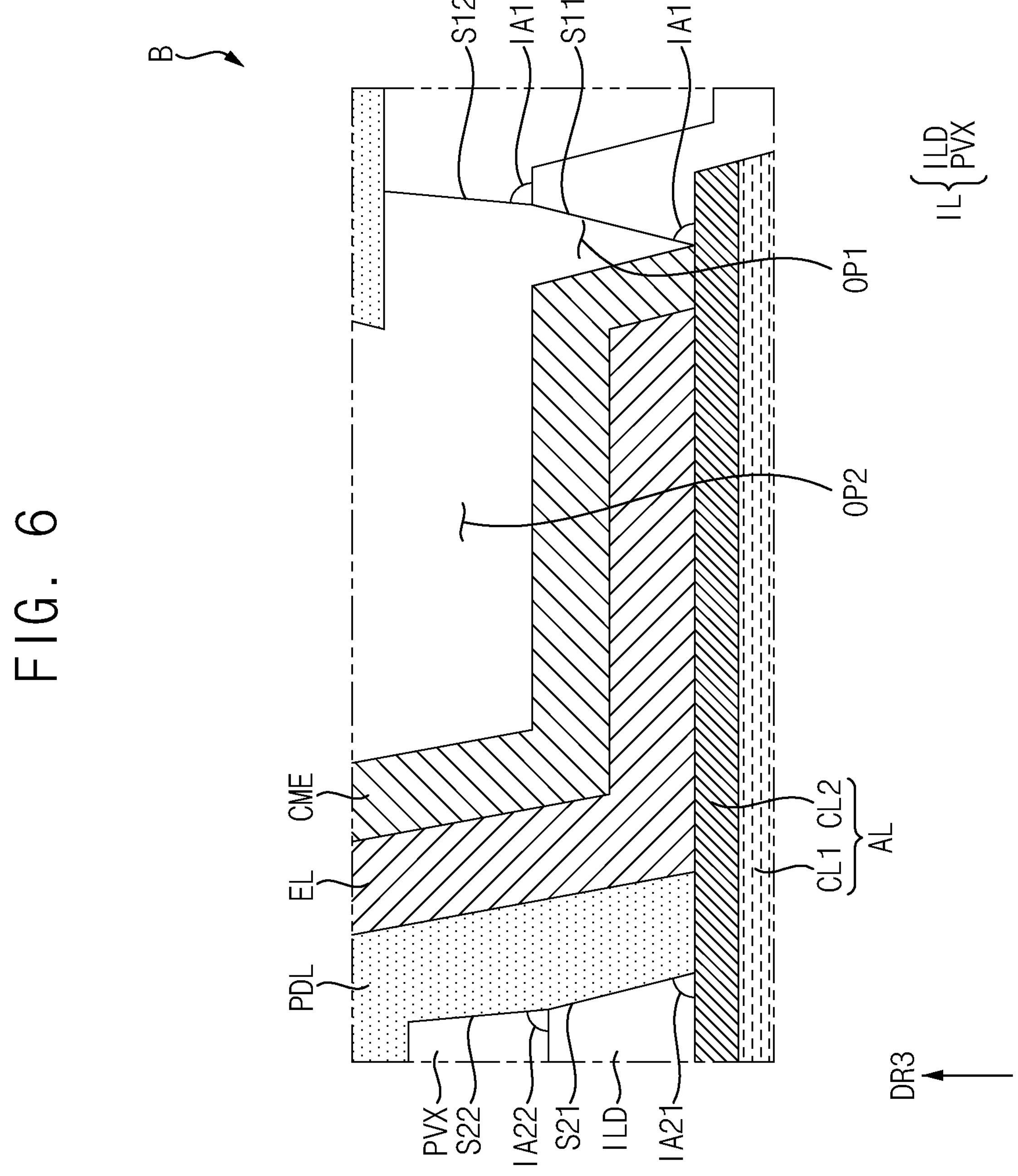
FIG. 6 is an enlarged cross-sectional view of area B of FIG. 5.

FIG. 4 is a cross-sectional view taken along line I-I' of FIG. 1. FIG. 5 is an enlarged cross-sectional view of area A of FIG. 4. FIG. 6 is an enlarged cross-sectional view of area B of FIG. 5.

Referring to FIGS. 4, 5, and 6, the display device 100 according to an embodiment of the present disclosure may include a substrate SUB, a lower metal layer BML, a power line VL, a buffer layer BUF, a gate insulation. layer GI, an interlayer insulating layer ILD, a transistor TR, the pad electrode PE, a connection pattern CP, an auxiliary power line AL, a protective layer PVX, a via insulating layer VIA, a light emitting element LED, a pixel defining layer PDL, and an encapsulation layer ENC.

Here, the transistor TR may include an active pattern ACT, a gate electrode GAT, a first electrode CE1 and a second electrode CE2. The light emitting element LED may include a pixel electrode PXE, a light emitting layer EL, and a common electrode CME.

The substrate SUB may include a transparent material or an opaque material. The substrate SUB may be made of a transparent resin substrate. Examples of the transparent resin substrate may include polyimide substrates and the like. In this case, the substrate SUB may include a first organic layer, a first barrier layer, and a second organic layer. Alternatively, the substrate SUB may include a quartz substrate, a synthetic quartz substrate, a calcium fluoride substrate, an F-doped quartz substrate, a soda-lime glass substrate, a non-alkali glass substrate, or the like. These may be used alone or in combination with each other.

The lower metal layer BML of the display area DA may be disposed on the substrate SUB. The lower metal layer BML may block external light incident on the transistor TR. For example, the lower metal layer BML may include a metal, an alloy, a metal nitride, a conductive metal oxide, a transparent conductive material, or the like. These may be used alone or in combination with each other.

The power line VL may be disposed in the display area DA on the substrate SUB. The power line VL may include the same material as the lower metal layer BML and may be disposed in the same layer as the lower metal layer BML. A common voltage (e.g., the common voltage ELVSS of FIGS. 2 and 3) may be applied to the power line VL.

The buffer layer BUF may be disposed on the substrate SUB. The buffer layer BUF may cover the lower metal layer BML and at least partially cover the power line VL in the display area DA. The buffer layer BUF may prevent diffusion of metal atoms or impurities from the substrate SUB into the transistor TR. In addition, the buffer layer BUF may improve flatness of the surface of the substrate SUB when the surface of the substrate SUB is not uniform. For example, the buffer layer BUF may include an inorganic insulating material such as silicon oxide ($SiO_x$), silicon nitride ($SiN_x$), silicon oxynitride ($SiO_xN_y$), or the like. These may be used alone or in combination with each other. Alternatively, the buffer layer BUF may be omitted.

The active pattern ACT may be disposed in the display area DA on the buffer layer BUF. For example, the active pattern ACT may include an inorganic semiconductor (e.g., amorphous silicon, polycrystalline silicon, or the like), an organic semiconductor, or a metal oxide semiconductor. For example, the metal oxide semiconductor may include a binary compound ($AB_x$), a ternary compound ($AB_xC_y$), a four-component compound ($AB_xC_yD_z$), or the like containing indium (In), zinc (Zn), gallium (Ga), tin (Sn), titanium (Ti), aluminum (Al), hafnium (Hf), zirconium (Zr), magnesium (Mg), or the like. For example, the metal oxide semiconductor may include zinc oxide ($ZnO_x$), gallium oxide ($GaO_x$), tin oxide ($SnO_x$), indium oxide ($InO_x$), indium gallium oxide (IGO), indium zinc oxide (IZO), indium tin oxide (ITO), indium zinc tin oxide (IZTO), indium gallium zinc oxide (IGZO), or the like. These may be used alone or in combination with each other.

The gate insulating layers GI may be respectively disposed on the buffer layer BUF and the active pattern ACT. The gate insulating layers GI may include an inorganic material. For example, the gate insulating layers GI may include an inorganic material such as silicon oxide, silicon nitride, silicon oxynitride, or the like. These may be used alone or in combination with each other. In an embodiment, in the display area DA, part of the gate insulating layer GI may be patterned to partially overlap the active pattern ACT, and another part of the gate insulating layer GI may be patterned to partially the buffer layer BUF. In addition, in the pad area PA, another one of the gate insulating layers GI may be patterned to overlap only a part of the buffer layer BUF. In another embodiment, the gate insulating layer GI may be entirely disposed on the buffer layer BUF to cover the active pattern ACT.

The gate electrode GAT may be disposed in the display area DA on the gate insulating layer GI. The gate electrode GAT may overlap the gate insulating layer GI. For example, the gate electrode GAT may include a metal, an alloy, a metal nitride, a conductive metal oxide, a transparent conductive material, or the like. These may be used alone or in combination with each other. In an embodiment, the gate electrode GAT may include a plurality of conductive layers.

The auxiliary power line AL may be disposed in the display area DA on the gate insulating layer GI. The common voltage (e.g., the common voltage ELVSS of FIGS. 2 and 3) may be applied to the auxiliary power line AL through the power line VL. The auxiliary power line AL may overlap the gate insulating layer GI. The auxiliary power line AL may include the same material as the gate electrode GAT and may be disposed in the same layer as the gate electrode GAT.

In an embodiment, the auxiliary power line AL may include a first conductive layer CL1 and a second conductive layer CL2 disposed on the first conductive layer CL1. The first and second conductive layers CL1 and CL2 may include different materials. For example, the first conductive layer CL1 may include metal, and the second conductive layer CL2 may include a transparent conductive material. The first conductive layer CL1 may include a metal such as titanium (Ti), copper (Cu), aluminum (Al), or the like. These may be used alone or in combination with each other. In an embodiment, the first conductive layer CL1 may include copper (Cu). The second conductive layer CL2 may include a conductive material such as indium tin oxide (ITO), indium zinc oxide (IZO), zinc oxide (ZnO), indium oxide ($In_2O_3$), indium gallium oxide (IGO), aluminum zinc oxide (AZO), or the like. These may be used alone or in combination with each other. In an embodiment, the second conductive layer CL2 may include indium tin oxide (ITO).

As the auxiliary power line AL includes the first conductive layer CL1 including copper (Cu) and the second conductive layer CL2 including a transparent conductive material and disposed on the first conductive layer CL1, occurrence of a defect due to oxidation of copper (Cu) included in the first conductive layer CL1 may be prevented.

However, the configuration of the present disclosure is not limited thereto, and the auxiliary power line AL may have a multilayer structure including three or more conductive layers. For example, the auxiliary power line AL may have a three-layer structure including a first conductive layer including titanium (Ti), a second conductive layer including copper (Cu), and a third conductive layer including indium tin oxide (ITO).

The gate electrode GAT may include the first and second conductive layers CL1 and CL2.

The pad electrode PE may be disposed in the pad area PA on the gate insulating layer GI. The pad electrode PE may include the same material as the gate electrode GAT and the auxiliary power line AL, and may be disposed in the same layer as the gate electrode GAT and the auxiliary power line AL. In an embodiment, the pad electrode PE may include a plurality of conductive layers.

The pad electrode PE may include the first and second conductive layers CL1 and CL2.

The interlayer insulating layer ILD may be disposed on the buffer layer BUF. The interlayer insulating layer ILD may be entirely disposed on the display area DA and the pad area PA. The interlayer insulating layer ILD may cover the active pattern ACT and the gate electrode GAT. The interlayer insulating layer ILD may include an inorganic material such as a silicon compound. For example, the interlayer insulating layer ILD may include an inorganic material such as silicon oxide, silicon nitride, silicon oxynitride, or the like. These may be used alone or in combination with each other. The interlayer insulating layer ILD may have a single-layer structure or a multi-layer structure including a plurality of insulating layers. The interlayer insulating layer ILD may be referred to as a first inorganic insulating layer.

In an embodiment, a first opening OP1 extending to at least a part of the upper surface of the auxiliary power line AL and a first contact hole CNT1 extending to at least a part of the upper surface of the pad electrode PE may be defined in the interlayer insulating layer ILD. As illustrated in FIG. 5, the first opening OP1 of the interlayer insulating layer ILD may have a first side surface S11 and a second side surface S21, and the first side surface S11 and the second side surface S21 may face each other.

The first electrode CE1 and the second electrode CE2 may be disposed in the display area DA on the interlayer insulating layer ILD. Each of the first and second electrodes CE1 and CE2 may be connected to the active pattern ACT through a contact hole penetrating the interlayer insulating layer ILD. In addition, the first electrode CE1 may be connected to the lower metal layer BML through a contact hole penetrating the interlayer insulating layer ILD and the buffer layer BUF. For example, each of the first and second electrodes CE1 and CE2 may include a metal, an alloy, a metal nitride, a conductive metal oxide, a transparent conductive material, or the like. These may be used alone or in combination with each other. In an embodiment, each of the first and second electrodes CE1 and CE2 may include a plurality of conductive layers.

Accordingly, the transistor TR including the active pattern ACT, the gate electrode GAT, the first electrode CE1 and the second electrode CE2 may be disposed in the display area DA on the substrate SUB. For example, the transistor TR may correspond to the first transistor T1 or the third transistor T3 illustrated in FIG. 3.

The connection pattern CP may be disposed in the display area DA on the interlayer insulating layer ILD. The connection pattern CP may be connected to the power line VL through a contact hole penetrating the interlayer insulating layer ILD and the buffer layer BUF. In addition, the connection pattern CP may be connected to the auxiliary power line AL through a contact hole penetrating the interlayer insulating layer ILD. Accordingly, the power line VL and the auxiliary power line AL may be electrically connected through the connection pattern CP. The connection pattern CP may include the same material as the first and second electrodes CE1 and CE2 and may be disposed in the same layer as the first and second electrodes CE1 and CE2.

The protective layer PVX may be disposed on the interlayer insulating layer ILD. The protective layer PVX may be disposed in the display area DA and the pad area PA. The protective layer PVX may at least partially cover the first electrode CE1 and may cover the second electrode CE1, and the connection pattern CP. The protective layer PVX may prevent the first and second electrodes CE1 and CE2 from being damaged by impurities or the like from the outside. The protective layer PVX may include an inorganic material such as a silicon compound. For example, the protective layer PVX may include an inorganic material such as silicon oxide, silicon nitride, silicon oxynitride, or the like. These may be used alone or in combination with each other. The protective layer PVX may have a single-layer structure or a multi-layer structure including a plurality of insulating layers. The protective layer PVX may be referred to as a second inorganic insulating layer.

In an embodiment, a second opening OP2 extending to at least a part of the upper surface of the auxiliary power line AL, a second contact hole CNT2 extending to at least a part of the upper surface of the pad electrode PE, and a third contact hole CNT3 extending to at least a part of the upper surface of the first electrode CE1 may be defined in the protective layer PVX. The second opening OP2 may be connected to the first opening OP1, and the second contact hole CNT2 may be connected to the first contact hole CNT1. In the pad area PA, the external device may be electrically connected to the pad electrode PE through the first and second contact holes CNT1 and CNT2.

Note that herein, in some instances, openings or contact holes are described as "connected." Another way of saying this is that two or more openings or two or more contact holes, etc., form an integral opening or an integral contact hole.

As illustrated in FIG. 5, the second opening OP2 of the protective layer PVX may have a first side surface S12 and a second side surface S22, and the first side surface S12 and the second side surface S22 may face each other.

The interlayer insulating layer ILD and the protective layer PVX may constitute one insulating layer IL. The insulating layer IL may have a first thickness TH1. For example, the first thickness TH1 may be about 2,000 Å to about 15,000 Å. In an embodiment, the first thickness TH1 of the insulating layer IL may be greater than or equal to a second thickness TH2 of the light emitting layer EL. When the first thickness TH1 of the insulating layer IL is smaller than the second thickness TH2 of the light emitting layer EL, the common electrode CME may not be electrically connected to the auxiliary power line AL.

Each of the first side surface S11 and the second side surface S21 of the first opening OP1 of the interlayer insulating layer ILD may extend from the upper surface of the auxiliary power line AL in a thickness direction (e.g., in the third direction DR3) at predetermined inclination angle. In addition, each of the first side surface S12 and the second side surface S22 of the second opening OP2 of the protective layer PVX may extend from the upper surface of the auxiliary power line AL in the thickness direction with a predetermined inclination angle.

As illustrated in FIG. 6, a first inclination angle IA11 formed between the first side surface S11 of the first opening OP1 and the upper surface of the auxiliary power line AL may be different from a second inclination angle IA12 between the first side surface S12 of the second opening OP2 and the upper surface of the auxiliary power line AL. Note that in FIG. 6, the angle mark for the second inclination angle IA12 is shown with respect to the upper surface of the interlayer insulating layer ILD, but the second inclination angle IA12 is also with respect to the upper surface of the auxiliary power line AL. In an embodiment, the first inclination angle IA11 formed between the first side surface S11 of the first opening OP1 and the upper surface of the auxiliary power line AL may be smaller than the second inclination angle IA12 between the first side surface S12 of the second opening OP2 and the upper surface of the auxiliary power line AL.

Similarly, a first inclination angle IA21 formed between the second side surface S21 of the first opening OP1 and the upper surface of the auxiliary power line AL may be different from a second inclination angle IA22 between the second side surface S22 of the second opening OP2 and the upper surface of the auxiliary power line AL. Note that in FIG. 6, the angle mark for the second inclination angle IA22 is shown with respect to the upper surface of the interlayer insulating layer ILD, but the second inclination angle IA22 is also with respect to the upper surface of the auxiliary power line AL. In an embodiment, the first inclination angle IA21 formed between the second side surface S21 of the first opening OP1 and the upper surface of the auxiliary power line AL may be smaller than the second inclination angle IA22 between the second side surface S22 of the second opening OP2 and the upper surface of the auxiliary power line AL.

That is, the first side surfaces S11 and S12 of the first and second openings OP1 and OP2 may have an incline difference, and the second side surfaces S21 and S22 of the first and second openings OP1 and OP2 may have an incline difference.

Meanwhile, the first inclination angle IA11 formed between the first side surface S11 of the first opening OP1 and the upper surface of the auxiliary power line AL may be different from the first inclination angle IA21 between the second side surface S21 of the first opening OP1 and the upper surface of the auxiliary power line AL. In addition, the second inclination angle IA12 formed between the first side surface S12 of the second opening OP2 and the upper surface of the auxiliary power line AL may be different from the second inclination angle IA22 between the second side surface S22 of the second opening OP2 and the upper surface of the auxiliary power line AL. That is, in cross-section view, the first opening OP1 may be formed asymmetrically with respect to the center of the first opening OP1, and the second opening OP2 may be formed asymmetrically with respect to the center of the second opening OP2.

In an embodiment, each of the first inclination angles IA11 and IA21 may be about 10 degrees to about 80 degrees, and each of the second inclination angles IA12 and IA22 may be about 10 degrees to about 80 degrees.

The via insulating layer VIA may be disposed in the display area DA on the protective layer PVX. The via insulating layer VIA may include an organic material. For example, the via insulating layer VIA may include an organic material such as a polyimide resin, a polyamide resin, a siloxane resin, an epoxy resin, or the like. These may be used alone or in combination with each other. In an embodiment, a via contact hole VCNT extending to at least a part of an upper surface of the first electrode PE1 may be defined in the via insulating layer VIA. The via contact hole VCNT may be connected to the third contact hole CNT3.

The via insulating layer VIA may be disposed only in a part of the display area DA. Specifically, an opening extending to at least a part of the upper surface of the protective layer PVX, at least a part of the upper surface of the auxiliary power line AL, and at least a part of the upper surface of the pad electrode PE in the pad area PA may be defined in the via insulating layer VIA.

The pixel electrode PXE may be disposed in the display area DA on the via insulating layer VIA. The pixel electrode PXE may be connected to the first electrode CE1 through the third contact hole CNT3 and the via contact hole VCNT. Accordingly, the pixel electrode PXE may be electrically connected to the transistor TR. The pixel electrode PXE may include a metal, an alloy, a metal nitride, a conductive metal oxide, a transparent conductive material, or the like. These may be used alone or in combination with each other. The pixel electrode PXE may operate as an anode.

The pixel defining layer PDL may be disposed in the display area DA on the via insulating layer VIA. A pixel opening extending to at least a part of an upper surface of the pixel electrode PXE may be defined in the pixel defining layer PDL. In an embodiment, as shown in FIG. 5, the pixel defining layer PDL may extend to into the first and second openings OP1 and OP2 to cover the second side surfaces S21 and S22 of the first and second openings OP1 and OP2. Meanwhile, the first side and second side surfaces S11 and S12 of the first and second openings OP1 and OP2 may be exposed from the pixel defining layer PDL and may contact the encapsulation layer ENC.

The pixel defining layer PDL may include an inorganic material and/or an organic material. For example, the pixel defining layer PDL may include an organic material such as an epoxy resin, a siloxane resin, or the like. These may be used alone or in combination with each other. Alternatively, the pixel defining layer PDL may further include a light blocking material containing a black pigment, black dye, or the like.

In an embodiment, a pixel contact hole PCNT extending to at least a part of the upper surface of the auxiliary power line AL may be further defined in the pixel defining layer PDL. The pixel contact hole PCNT may be connected to the second opening OP2. Accordingly, the first opening OP1, the second opening OP2, and the pixel contact hole PCNT may constitute a groove GV. The groove GV may expose at least a part of the upper surface of the auxiliary power line AL.

As illustrated in FIG. 5, the pixel contact hole PCNT may have a first side surface S13 and a second side surface S23, and the first side surface S13 and the second side surface S23 may face each other. In an embodiment, the first side surface S13 of the pixel contact hole PCNT may protrude more toward the center of the groove GV than the first side surfaces S11 and S12 of the first and second openings OP1 and OP2. Here, a portion of the pixel defining layer PDL adjacent to the first side surface S13 of the pixel contact hole PCNT may be defined as a protrusion PP. That is, an end of the pixel defining layer PDL may include the protrusion PP protruding toward the center of the pixel contact hole PCNT.

In an embodiment, the protrusion PP of the pixel defining layer PDL may constitute an undercut shape UC together with the first side surfaces S11 and S12 of the first and second openings OP1 and OP2. That is, the undercut shape UC may be defined by the protrusion PP of the pixel defining layer PDL and the first side surfaces S11 and S12 of the first and second openings OP1 and OP2. The undercut shape UC may partially overlap the auxiliary power line AL.

In an embodiment, a length L of the protrusion PP protruding toward the center of the pixel contact hole PCNT may be about 0.1 micrometers (um) to about 5 micrometers (um). Preferably, the length L of the protrusion PP toward the center of the pixel contact hole PCNT may be about 0.5 um to about 1.5 um.

In this specification, the first side surfaces S11, S12, and S13 may all face the same direction, and the second side surfaces S21, S22, and S23 may all face the same direction.

The light emitting layer EL may be disposed in the display area DA on the pixel electrode PXE, the pixel defining layer PDL, and the auxiliary power line AL. That is, the light emitting layer EL may be disposed on the whole surface of the display area DA. The light emitting layer EL may be disposed on the auxiliary power line AL and extend to at least a part of an upper surface of the auxiliary power line AL. For example, the light emitting layer EL may have a multilayer structure including a hole injection layer, a hole transport layer, an organic light emitting layer, an electron transport layer, and an electron injection layer. In an embodiment, the light emitting layer EL may be disconnected by the protrusion PP of the pixel defining layer PDL. That is, the light emitting layer EL may be disconnected by the undercut shape UC.

The common electrode CME may be disposed in the display area DA on the light emitting layer EL. That is, the common electrode CME may be disposed on the entire surface of the display area DA. The common electrode CME may receive a common voltage (e.g., the common voltage ELVSS of FIGS. 2 and 3) from the auxiliary power line AL. For example, the common electrode CME may include a metal, an alloy, a metal nitride, a conductive metal oxide, a transparent conductive material, or the like. These may be used alone or in combination with each other. The common electrode CME may operate as a cathode.

In an embodiment, the common electrode CME may be disconnected by the undercut shape UC. Accordingly, the common electrode CME may be electrically connected to the auxiliary power line AL. In detail, the common electrode CME may directly contact the auxiliary power line AL exposed by the light emitting layer EL. For example, the common electrode CME may contact at least a part of the upper surface of the auxiliary power line AL. In addition, the common electrode CME may cover a side surface of the light emitting layer EL adjacent to the auxiliary power line AL. As the common electrode CME is electrically connected to the auxiliary power line AL, a voltage drop of the common voltage applied to the common electrode CME may be prevented.

Accordingly, the light emitting device LED including the pixel electrode PXE, the light emitting layer EL, and the common electrode CME may be disposed in the display area DA on the substrate SUB. The light emitting element LED may be electrically connected to the transistor TR.

The encapsulation layer ENC may be disposed in the display area DA on the common electrode CME. The encapsulation layer ENC may cover the light emitting element LED. The encapsulation layer ENC may seal the display area DA to protect the light emitting element LED from external impurities. The encapsulation layer ENC may include at least one inorganic encapsulation layer and at least one organic encapsulation layer.

In an embodiment, the encapsulation layer ENC may fill the inside of the undercut shape UC. Specifically, the encapsulation layer ENC may fill an empty space of the groove GV. That is, the encapsulation layer ENC may fill an empty space between the auxiliary power line AL and the protrusion PP.

The display device 100 according to an embodiment of the present disclosure may include a first inorganic insulating layer (e.g., the interlayer insulating layer ILD) defining the first opening OP1 extending to at least a part of the upper surface of the auxiliary power line AL to which the common voltage is applied, a second inorganic insulating layer (e.g., the protective layer PVX) disposed on the first inorganic insulating layer defining the second opening OP2 connected to the first opening OP1, the pixel defining layer PDL disposed on the second inorganic insulating layer, defining the pixel contact hole PCNT connected to the first and second openings OP1 and OP2, an end of the pixel defining layer PDL including the protrusion PP protruding toward the center of the pixel contact hole PCNT, and the common electrode CME disposed on the pixel defining layer PDL and electrically connected to the auxiliary power line AL. In this case, the protrusion PP may define the undercut shape UC together with side surfaces of the first and second openings OP1 and OP2 exposed from the pixel defining layer PDL. Accordingly, defects caused by the common electrode CME not being electrically connected to the auxiliary power line AL may be improved.

FIGS. 7, 8, 9, 10, 11, 12, 13, 14, 15, 16, 17, 18, 19, 20, 21, and 22 are cross-sectional views for explaining a method for manufacturing the display device of FIG. 4.

Figure 7:
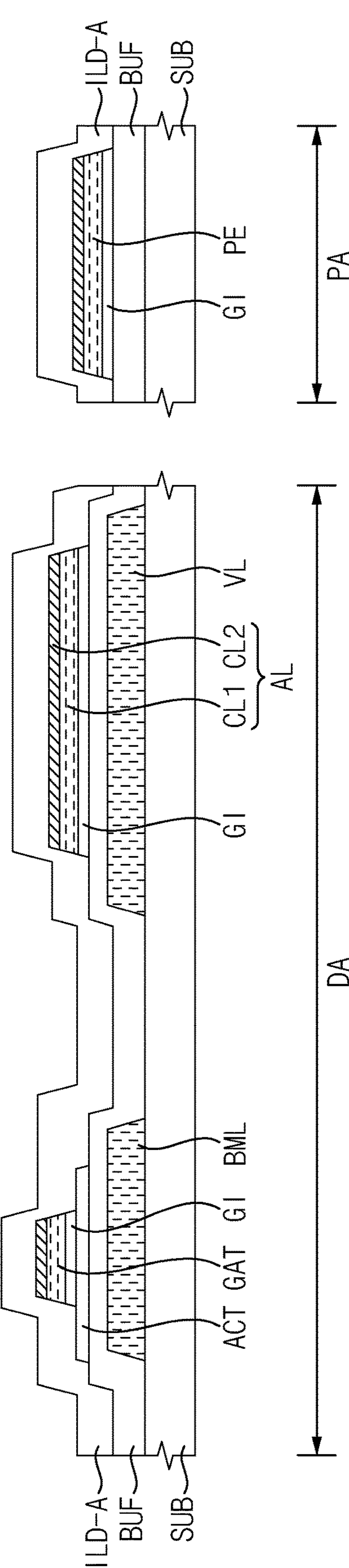

Referring to FIG. 7, the lower metal layer BML, the power line VL, the buffer layer BUF, the active pattern ACT, the gate insulating layers GI, the gate electrode GAT, and the auxiliary power line AL, and the pad electrode PE may be sequentially formed on the substrate SUB.

A preliminary interlayer insulating layer ILD-A may be formed on the buffer layer BUF. The preliminary interlayer insulating layer ILD-A may be entirely formed in the display area DA and the pad area PA. The preliminary interlayer insulating layer ILD-A may cover the active pattern ACT, the gate electrode GAT, the auxiliary power line AL, and the pad electrode PE. For example, the preliminary interlayer insulating layer ILD-A may be formed using silicon oxide, silicon nitride, silicon oxynitride, or the like. The preliminary interlayer insulating layer ILD-A may be referred to as a first preliminary inorganic insulating layer.

Figure 8:
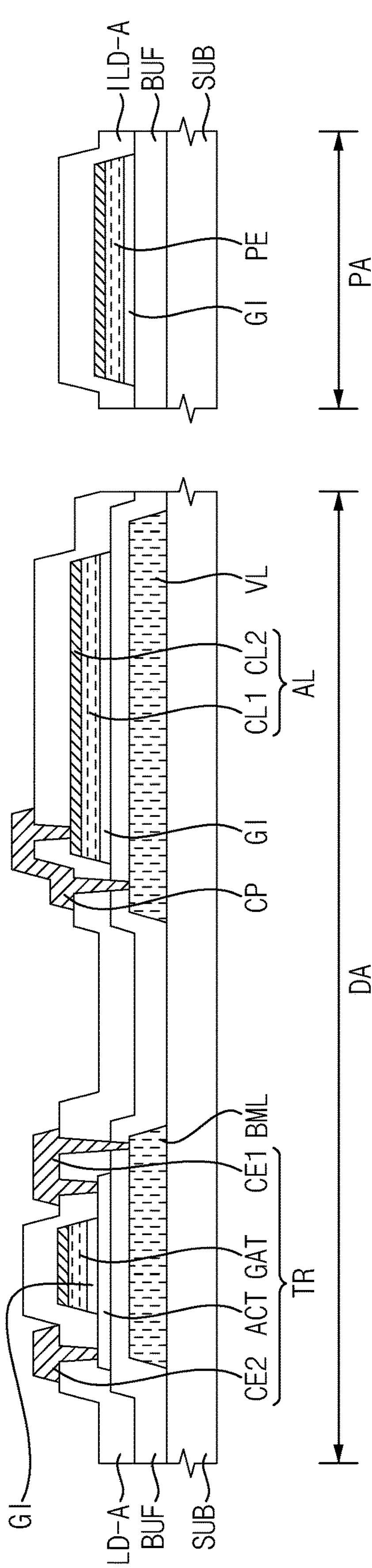

Referring to FIG. 8, the first electrode CE1, the second electrode CE2, and the connection pattern CP may be formed in the display area DA on the preliminary interlayer insulating layer ILD-A. The first electrode CE1 and the second electrode CE2 may be connected to the active pattern ACT through a contact hole formed by removing a part of the preliminary interlayer insulating layer ILD-A. In addition, the first electrode CE1 may be connected to the lower metal layer BML through a contact hole formed by removing parts of the buffer layer BUF and the preliminary interlayer insulating layer ILD-A.

The connection pattern CP may be connected to the auxiliary power line AL through a contact hole formed by removing a part of the preliminary interlayer insulating layer ILD-A. In addition, the connection pattern CP may be connected to the power line VL through a contact hole formed by removing parts of the buffer layer BUF and the preliminary interlayer insulating layer ILD-A. The connection pattern CP may be simultaneously formed through the same process as the first and second electrodes CE1 and CE2.

Figure 9:
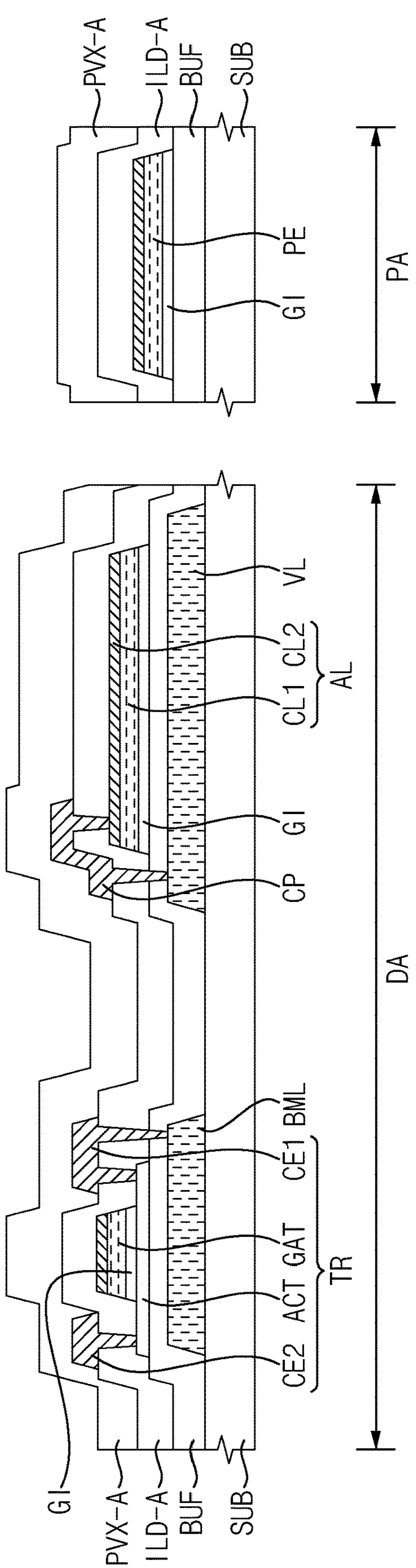

Referring to FIG. 9, a preliminary protective layer PVX-A may be formed on the preliminary interlayer insulating layer ILD-A. The preliminary protective layer PVX-A may be entirely formed on the display area DA and the pad area PA. For example, the preliminary protective layer PVX-A may be formed using silicon oxide, silicon nitride, silicon oxynitride, or the like. The preliminary protective layer PVX-A may be referred to as a second preliminary inorganic insulating layer.

Figure 10:
Figure 10:
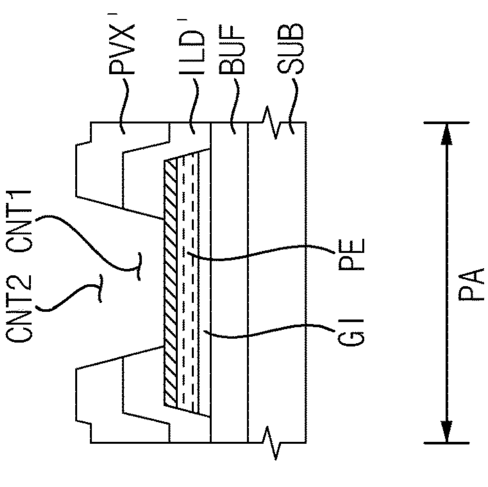
Figure 10:
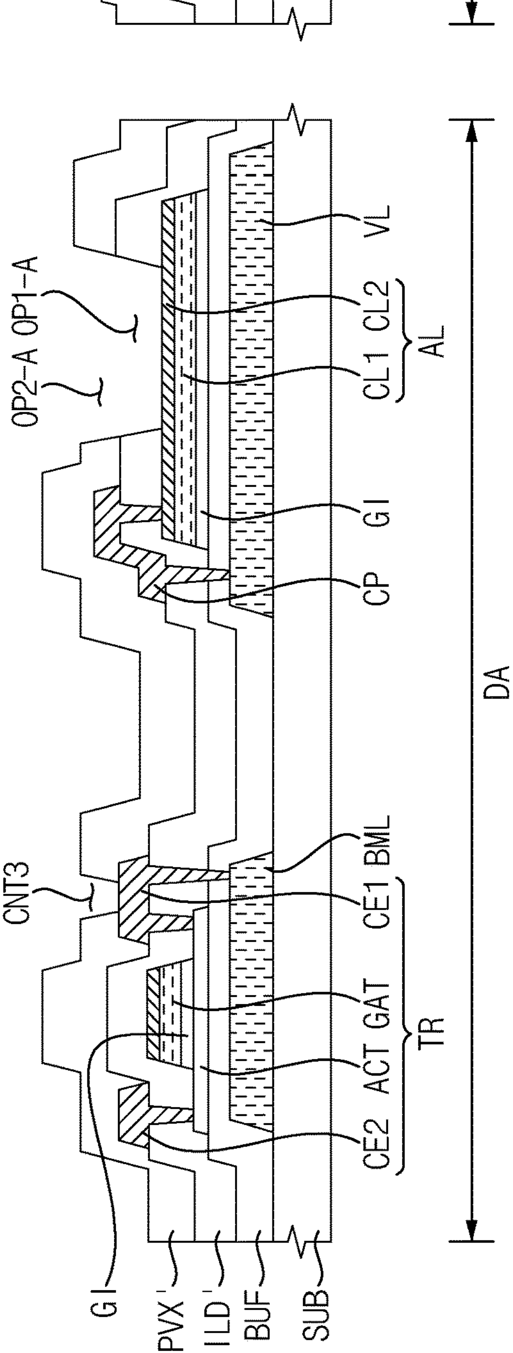

Referring to FIG. 10, parts of the preliminary interlayer insulating layer ILD-A and the preliminary protective layer PVX-A may be removed through a first etching process. Specifically, through the first etching process, the first and second contact holes CNT1 and CNT2 exposing at least a part of the upper surface of the pad electrode may be formed by removing parts of the preliminary interlayer insulating layer ILD-A and the preliminary protective layer PVX-A in the pad area PA. The first and second contact holes CNT1 and CNT2 may be connected to each other.

Meanwhile, through the first etching process, the third contact hole CNT3 exposing at least a part of the upper surface of the first electrode CE1 may be formed by removing a part of the preliminary interlayer insulating layer ILD-A in the display area DA and first and second preliminary openings OP1-A and OP2-A exposing at least a part of the upper surface of the auxiliary power line AL may be formed by removing parts of the preliminary interlayer insulating layer ILD-A and the preliminary protective layer PVX-A in the display area DA. The first and second preliminary openings OP1-A and OP2-A may be connected to each other.

Accordingly, an interlayer insulating layer ILD' defining the first contact hole CNT1 and the first preliminary opening OP1-A may formed, and a protective layer PVX' defining the second contact hole CNT2, the third contact hole CNT3, and the second preliminary opening OP2-A may formed.

The first, second, and third contact holes CNT1, CNT2, and CNT3 and the first and second preliminary openings OP1-A and OP2-A may be simultaneously formed through the first etching process. In an embodiment, the first etching process may be a dry etching process.

Figure 11:
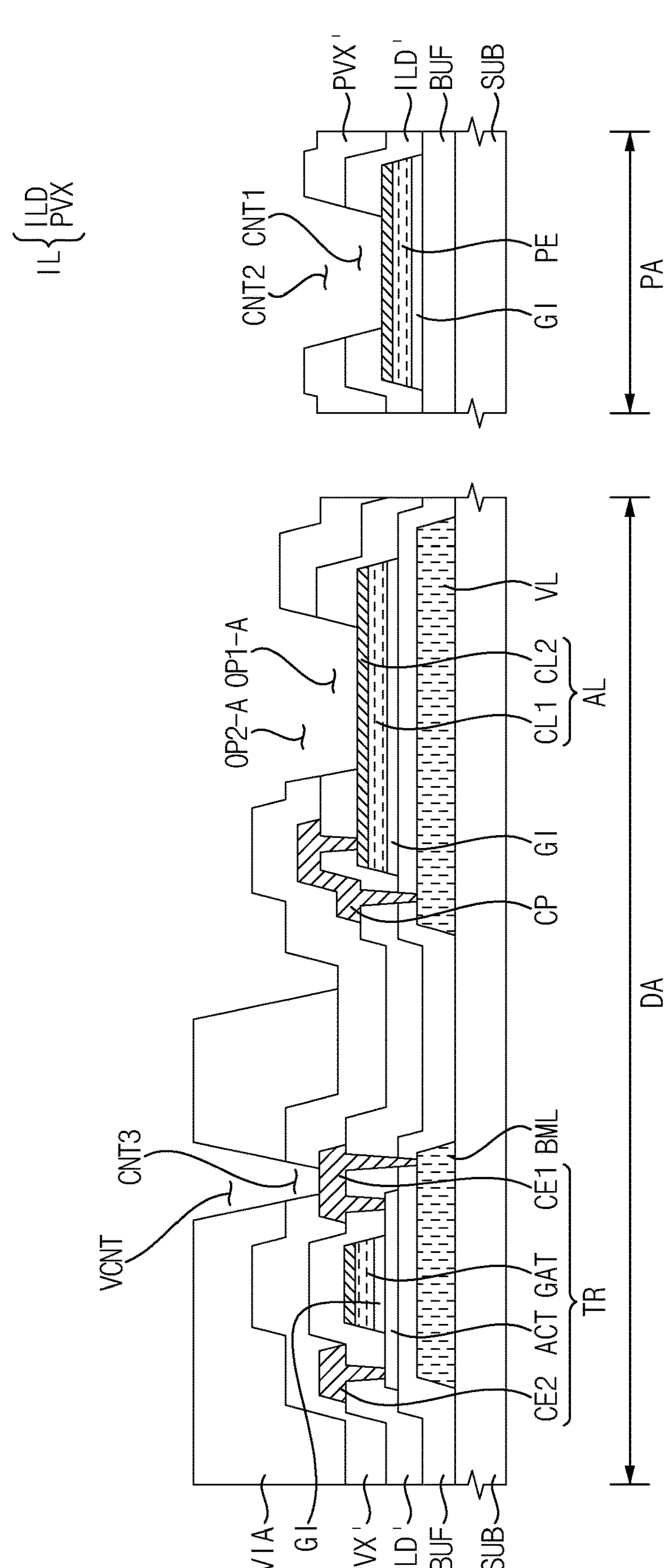

Referring to FIG. 11, the via insulating layer VIA may be formed in the display area DA on the protective layer PVX'. The via contact hole VCNT exposing at least a part of the upper surface of the first electrode CE1 may be formed in the via insulating layer VIA. The via contact hole VCNT may be connected to the third contact hole CNT3. For example, the via insulation layer VIA may be formed using an organic material.

The via insulating layer VIA may be formed only in a part of the display area DA. Specifically, an opening exposing at least a part of the upper surface of the protective layer PVX, at least a part of the upper surface of the auxiliary power line AL in the display area DA, and at least a part of the upper surface of the pad electrode PE in the pad area PA may be formed in the via insulating layer VIA.

Figure 12:
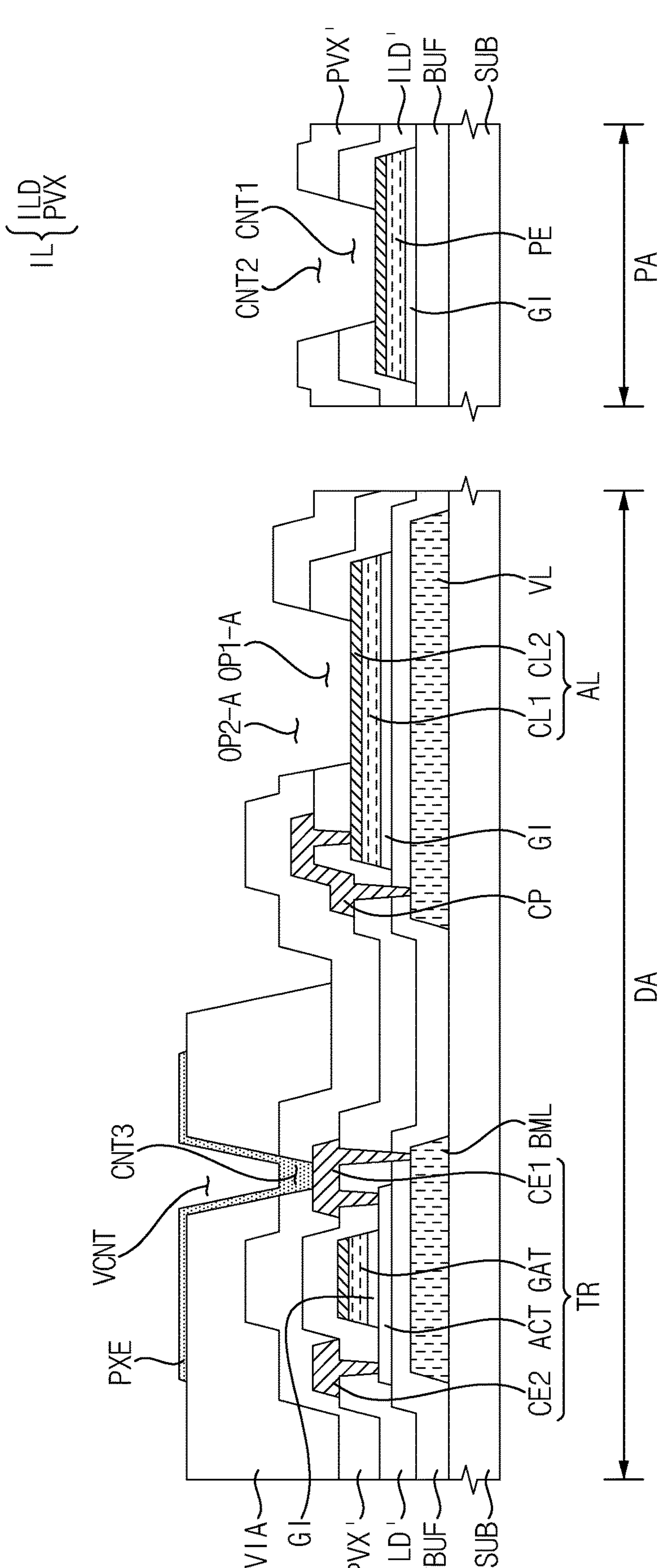

Referring to FIG. 12, the pixel electrode PXE may be formed in the display area DA on the via insulating layer VIA. The pixel electrode PXE may be connected to the first electrode CE1 through the third contact hole CNT3 and the via contact hole VCNT.

Figure 13:
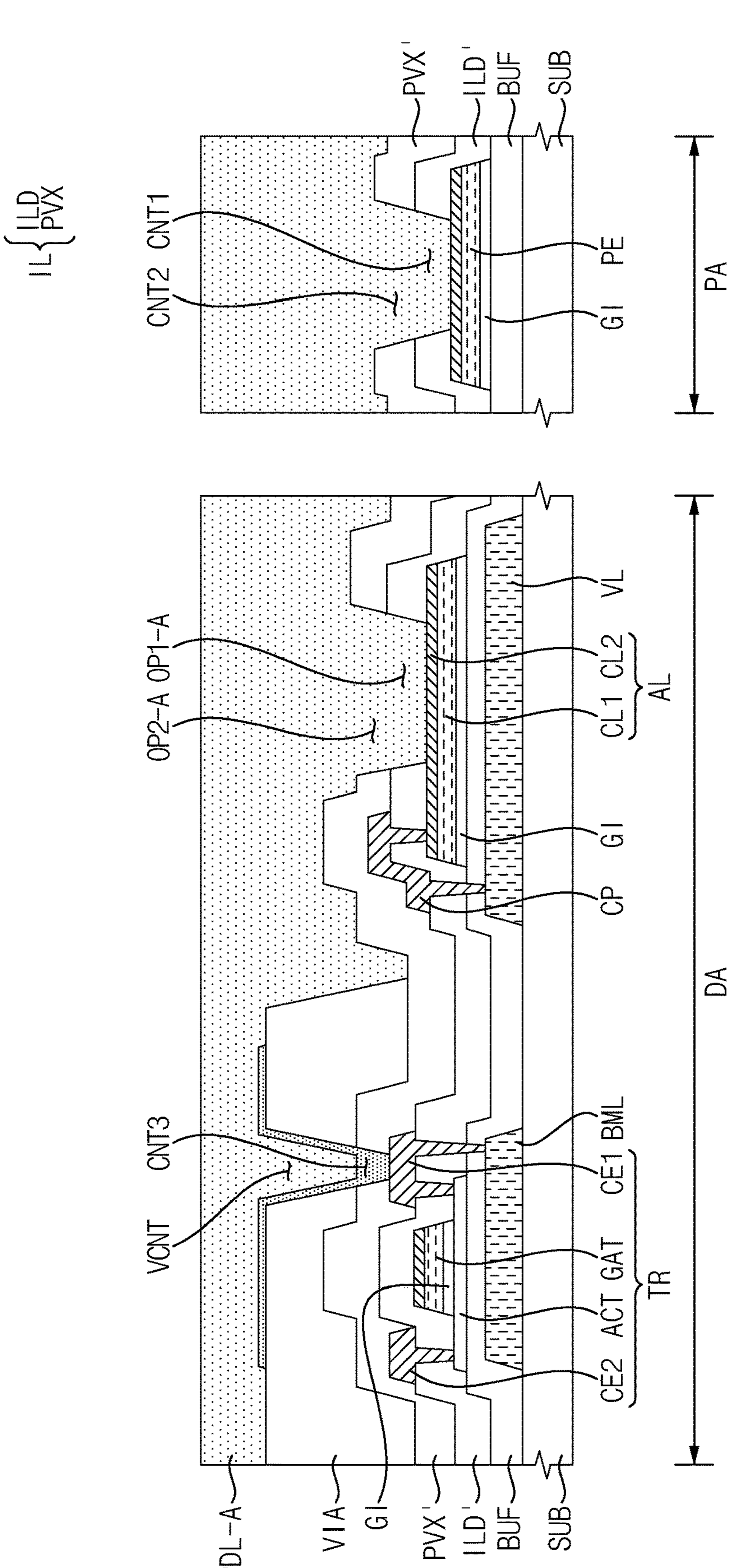
Figure 14:
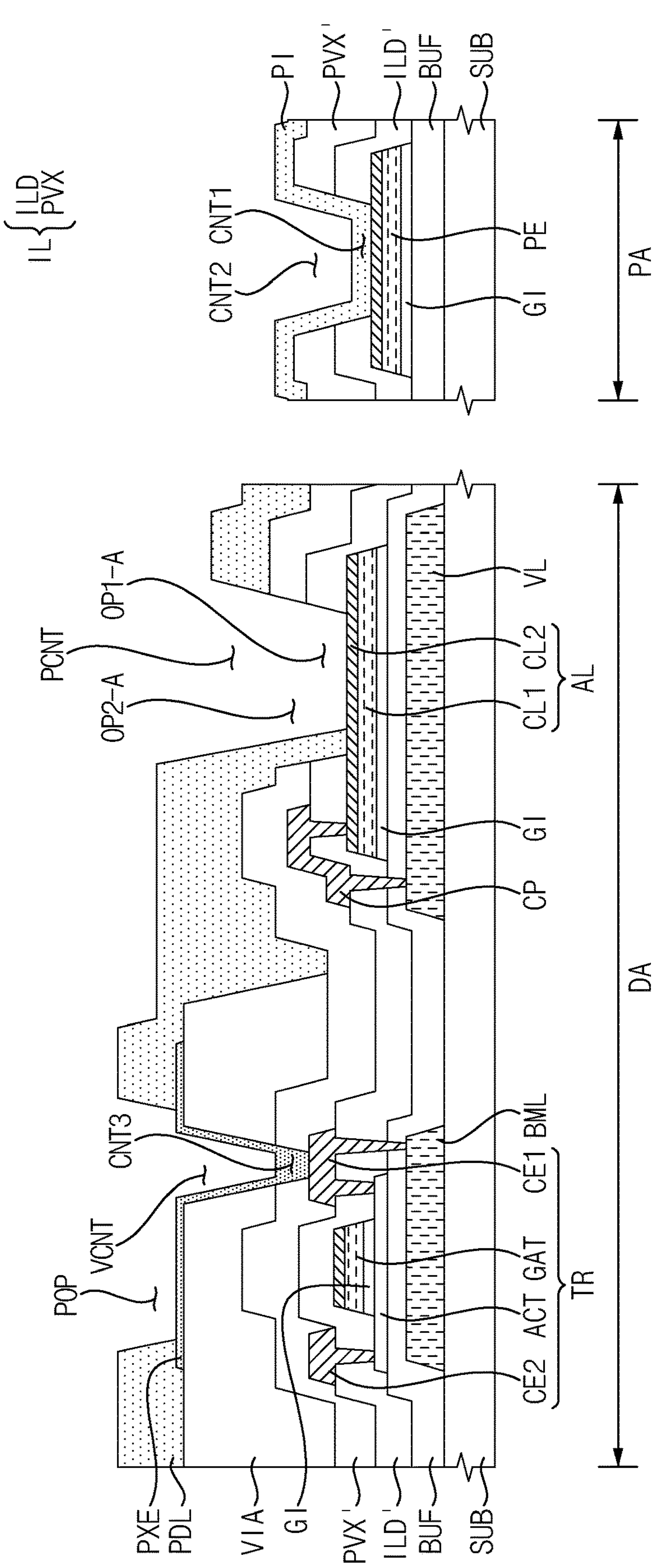

Referring to FIGS. 13 and 14, a preliminary pixel defining layer PDL-A may be formed on the via insulating layer VIA, the pixel electrode PXE, and the protective layer PVX'. The preliminary pixel defining layer PDL-A may be entirely formed in the display area DA and the pad area PA. That is, the preliminary pixel defining layer PDL-A may fill the via contact hole VCNT, the first preliminary opening OP1-A and the second preliminary opening OP2-A in the display area DA, and may fill the first contact hole CNT1 and the second contact hole CNT2 in the pad area PA. For example, the preliminary pixel defining layer PDL-A may be formed using an organic material.

In an embodiment, a part of the preliminary pixel defining layer PDL-A overlapping the display area DA and a part of the preliminary pixel defining layer PDL-A overlapping the pad area PA may be removed by selectively exposing and developing the preliminary pixel defining layer PDL-A through a halftone mask.

Accordingly, the pixel defining layer PDL in which a pixel opening POP and the pixel contact hole PCNT are defined in the display area DA and a protective insulating layer PI in the pad area PA may be formed. For example, the pixel defining layer PDL and the protective insulating layer PI may be integrally formed. In an embodiment, a thickness of the pixel defining layer PDL may be thicker than a thickness of the protective insulating layer PI.

The protective insulating layer PI may cover the protective layer PVX' in the pad area PA and may contact the exposed upper surface of the pad electrode PE. The protective insulating layer PI may serve to protect the surface of the pad electrode PE in a subsequent process.

Figure 16:
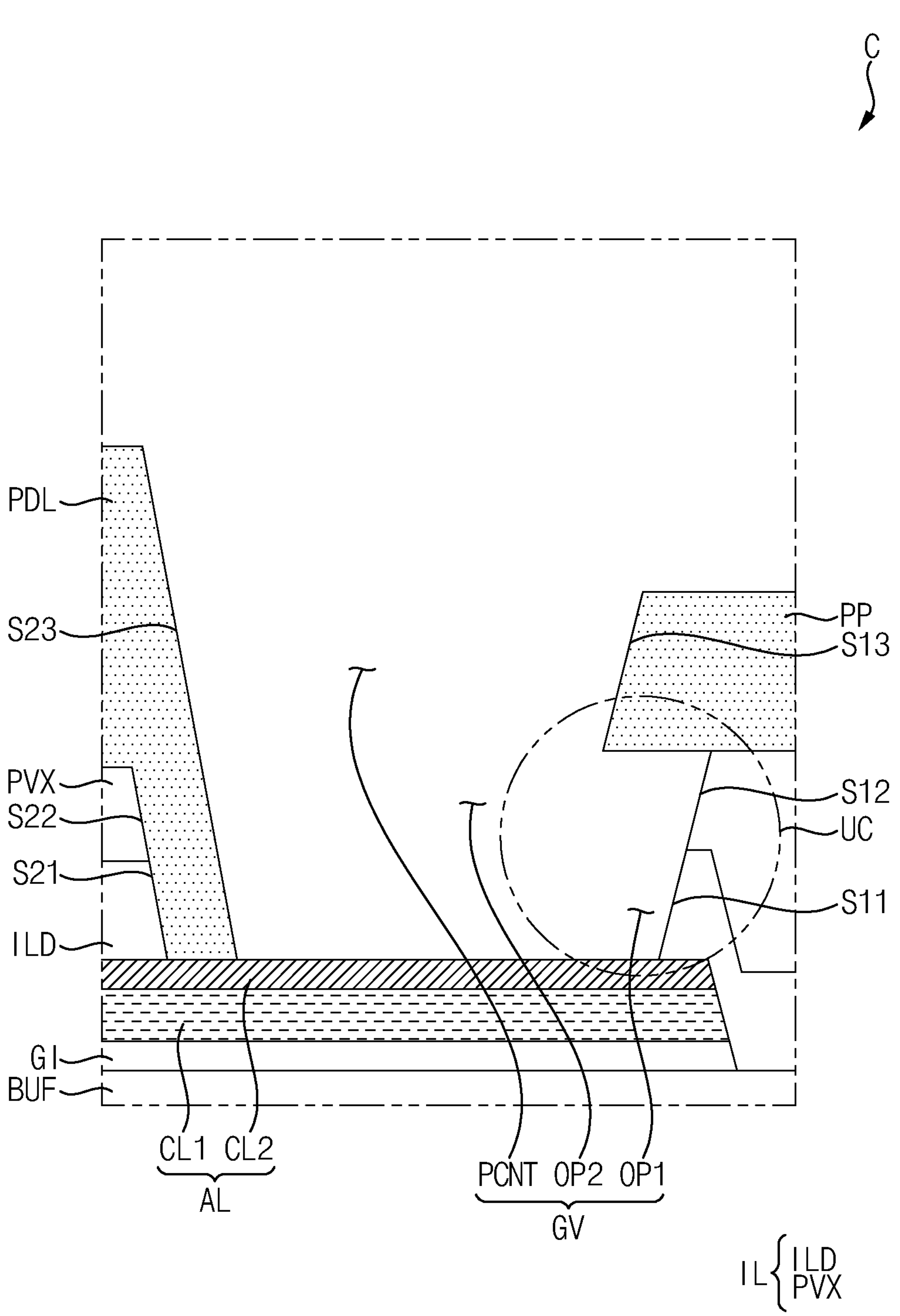

The pixel opening POP may be connected to the via contact hole VCNT, the pixel contact hole PCNT may have the first side surface S13 and the second side surface S23, and connected to the first and second preliminary openings OP1-A, OP2-A (see FIG. 16). The pixel opening POP and the pixel contact hole PCNT may be simultaneously formed through the same process.

Figure 15:
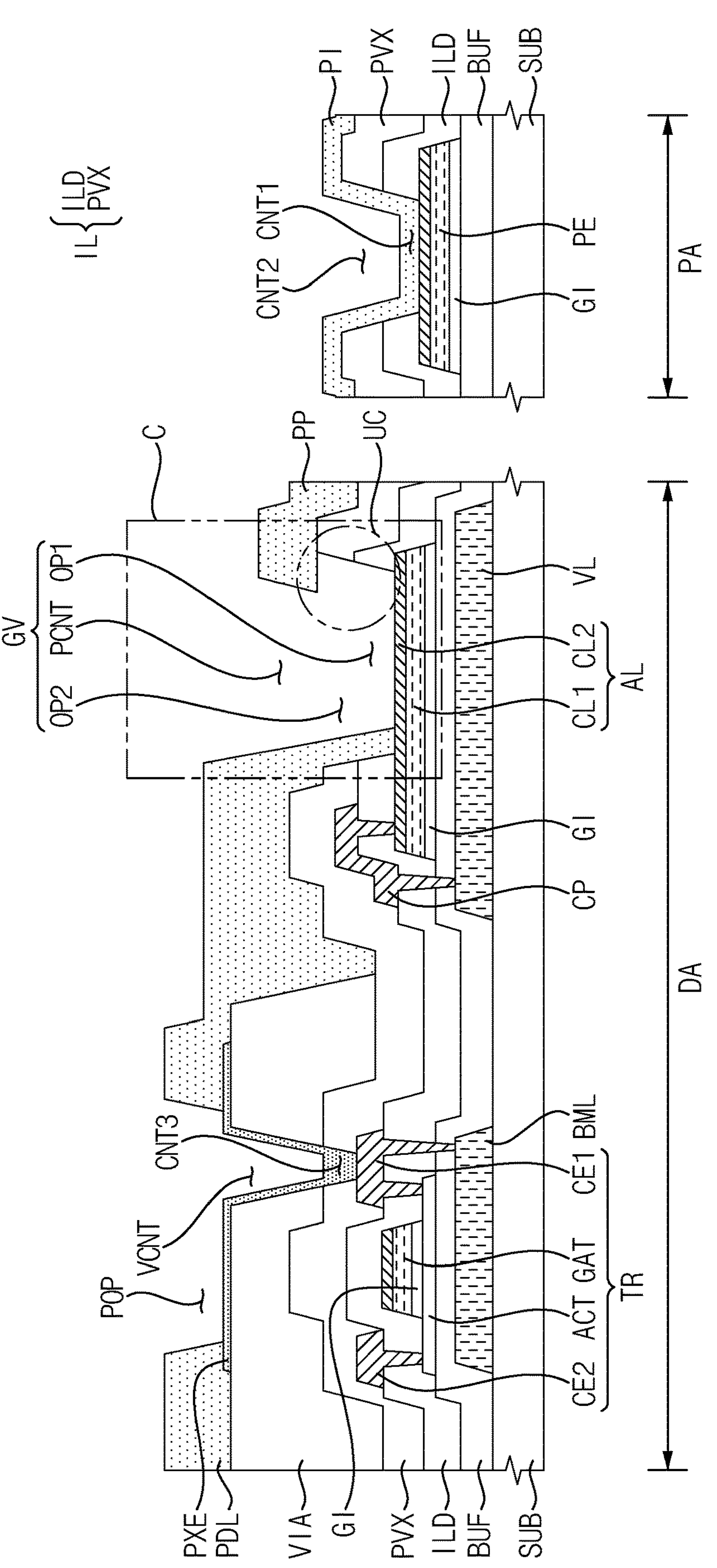

Referring to FIGS. 14, 15, and 16, parts of the interlayer insulating layer ILD' and the protective layer PVX' overlapping the pixel defining layer PDL and the auxiliary power line AL may be removed through a third etching process. Specifically, the parts of the interlayer insulating layer ILD' and the protective layer PVX' exposed from the pixel defining layer PDL may be removed through the third etching process. In an embodiment, the third etching process may be a wet etching process using a buffered oxide etchant (BOE).

As parts of the interlayer insulating layer ILD' and the protective layer PVX' are removed through the third etching process, the first opening OP1 having the first side surface S11 and the second side surface S21 may be formed in the interlayer insulating layer ILD and the second opening OP2 having the first side surface S21 and the second side surface S22 may be formed in the protective layer PVX. For example, the first and second openings OP1 and OP2 may have larger areas than the first and second preliminary openings OP1-A and OP2-A. That is, the first opening OP1 may be formed by extending the first preliminary opening OP1-A, and the second opening OP2 may be formed by extending the second preliminary opening OP2-A.

Through this, the first opening OP1, the second opening OP2, and the pixel contact hole PCNT may be connected to each other to form the groove GV. The groove GV may expose at least a part of the upper surface of the auxiliary power line AL.

In addition, as parts of the interlayer insulating layer ILD and the protective layer PVX are removed through the third etching process, the first side surface S13 of the pixel contact hole PCNT may protrude more toward the center of the pixel contact hole PCNT than the first side surfaces S11 and S12 of the first and second openings OP1 and OP2. Accordingly, the end of the pixel defining layer PDL may include the protrusion PP protruding toward the center of the pixel contact hole PCNT. That is, the protrusion PP may form the undercut shape UC together with the first side surfaces S11 and S12 of the first and second openings OP1 and OP2.

Figure 17:
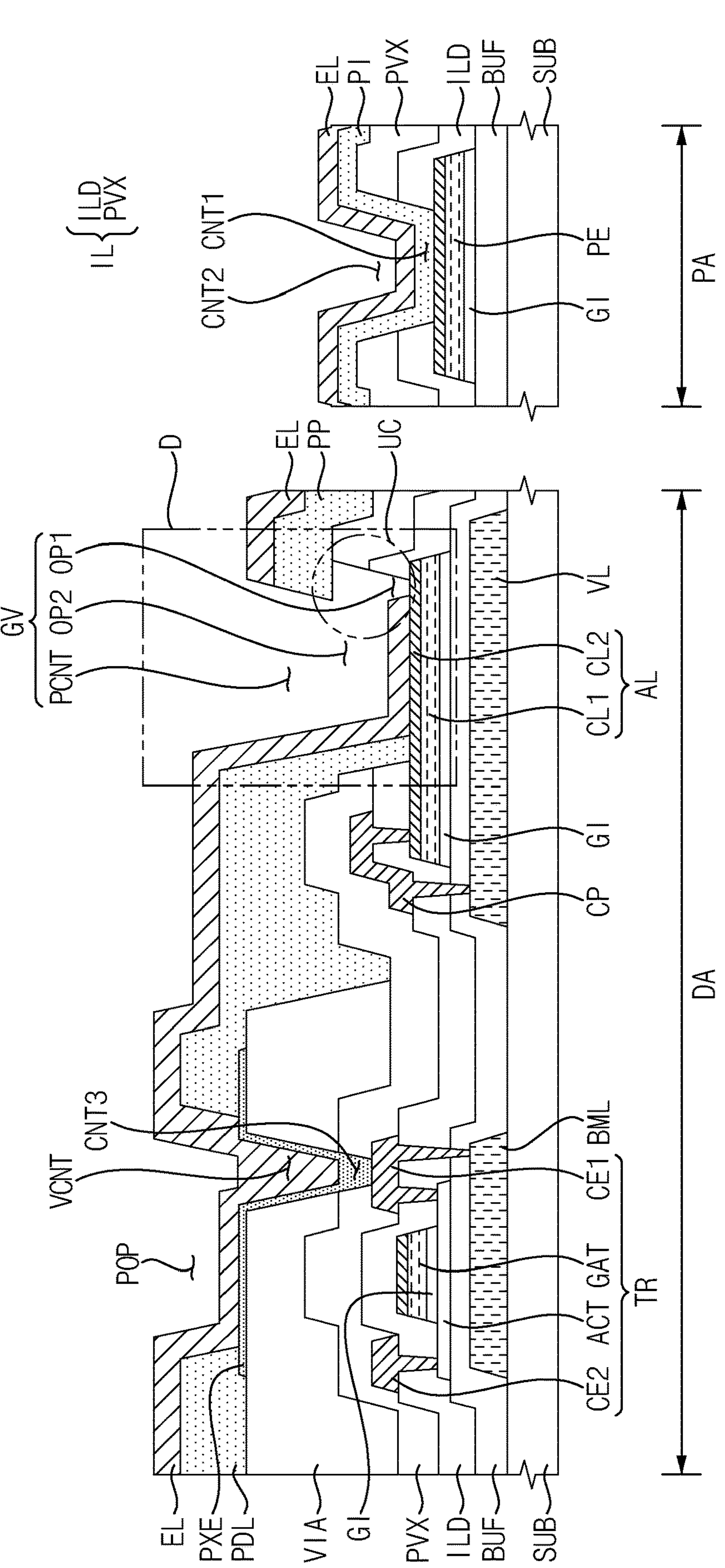
Figure 18:
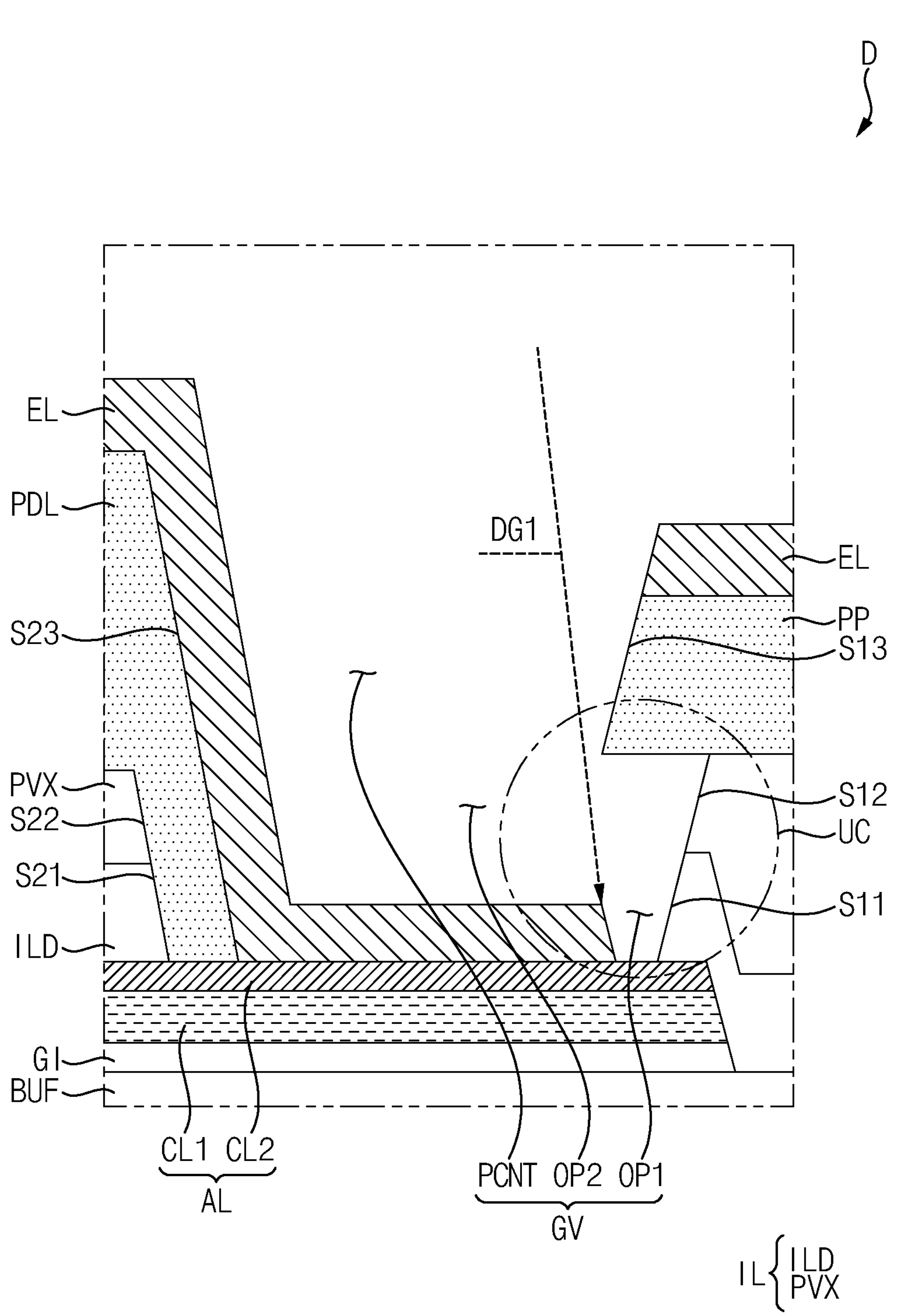

Referring to FIGS. 17 and 18, the light emitting layer EL may be formed on the pixel defining layer PDL, the pixel electrode PXE, the auxiliary power line AL, and the protective insulating layer PI. In an embodiment, the light emitting layer EL may be deposited at a first angle DG1.

In an embodiment, the light emitting layer EL may be entirely formed in the display area DA and the pad area PA. In this case, a part of the light emitting layer EL overlapping the pad area PA may be removed in a subsequent process. In another embodiment, the light emitting layer EL may be entirely formed only on the display area DA.

In an embodiment, the light emitting layer EL may be disconnected by the protrusion PP of the pixel defining layer PDL. That is, the light emitting layer EL may be disconnected by the undercut shape UC.

Figure 19:
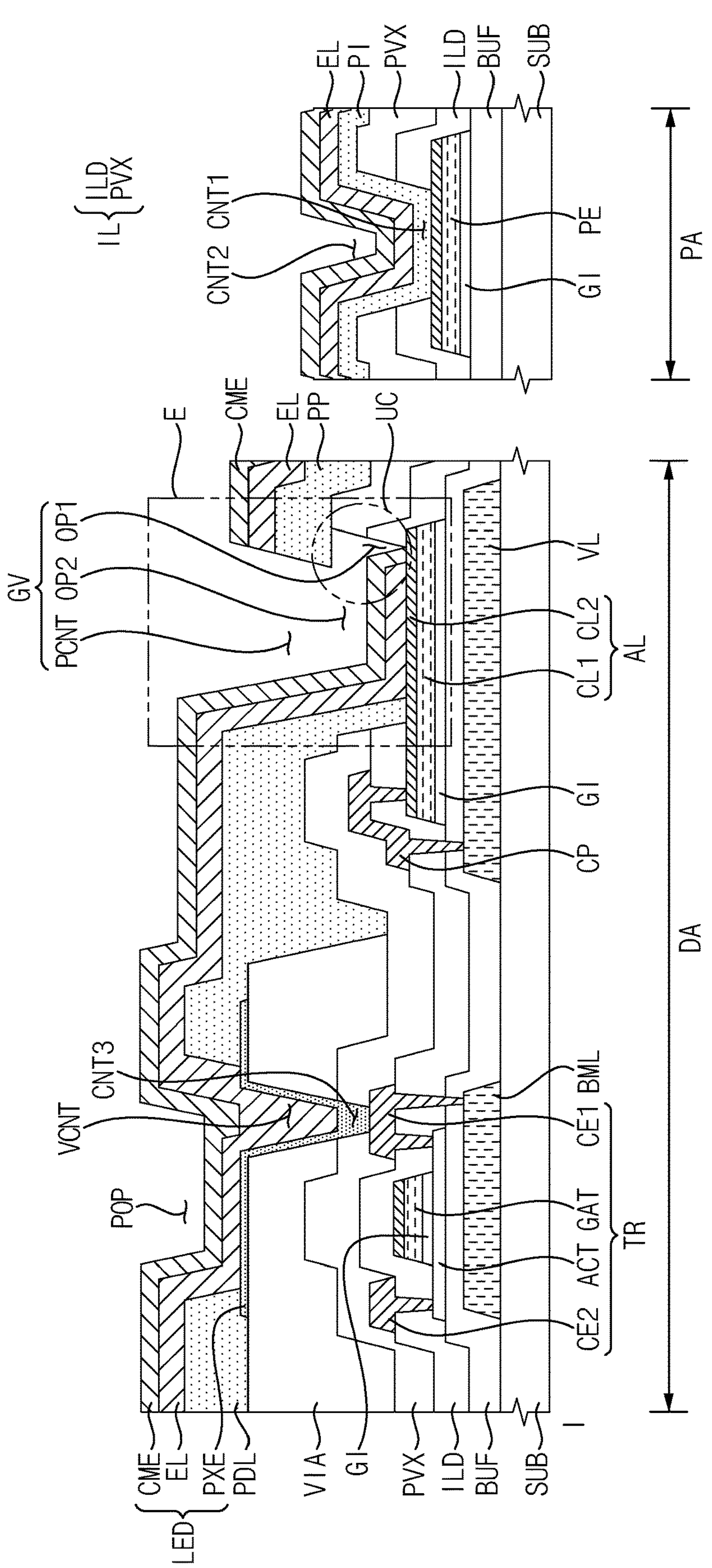
Figure 20:
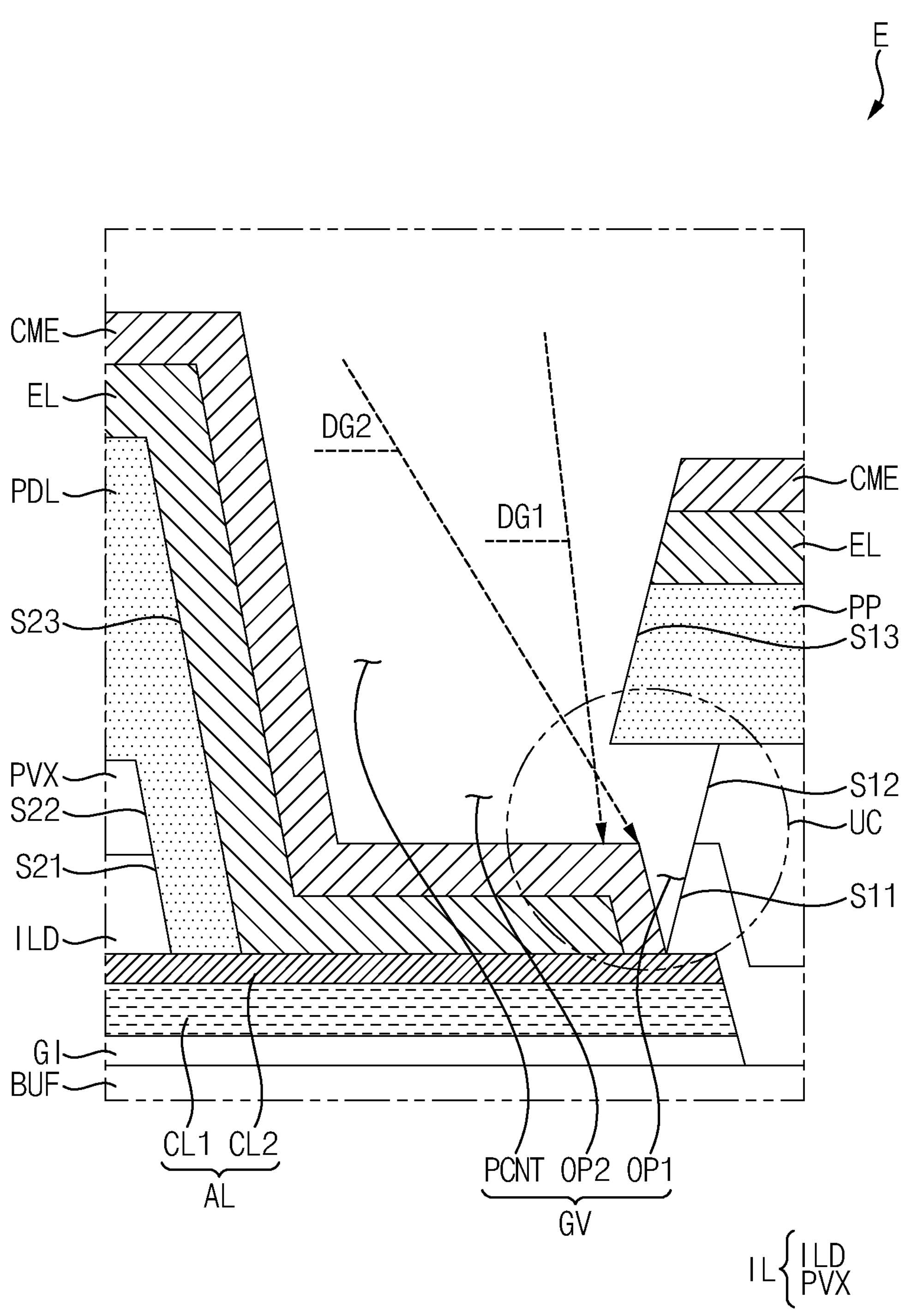

Referring to FIGS. 19 and 20, the common electrode CME may be formed on the light emitting layer EL. In an embodiment, the common electrode CME may be deposited at the second angle DG2. For example, the first angle DG1 may be greater than the second angle DG2. That is, the common electrode CME may be deposited at a lower angle than the light emitting layer EL. Accordingly, the common electrode CME may cover the side surface of the light emitting layer EL.

In an embodiment, the common electrode CME may be entirely formed in the display area DA and the pad area PA. In this case, a part of the common electrode CME overlapping the pad area PA may be removed in a subsequent process. In another embodiment, the common electrode CME may be entirely formed only in the display area DA.

In an embodiment, the common electrode CME may be disconnected by the undercut shape UC. Accordingly, the common electrode CME may be electrically connected to the auxiliary power line AL.

Figure 21:
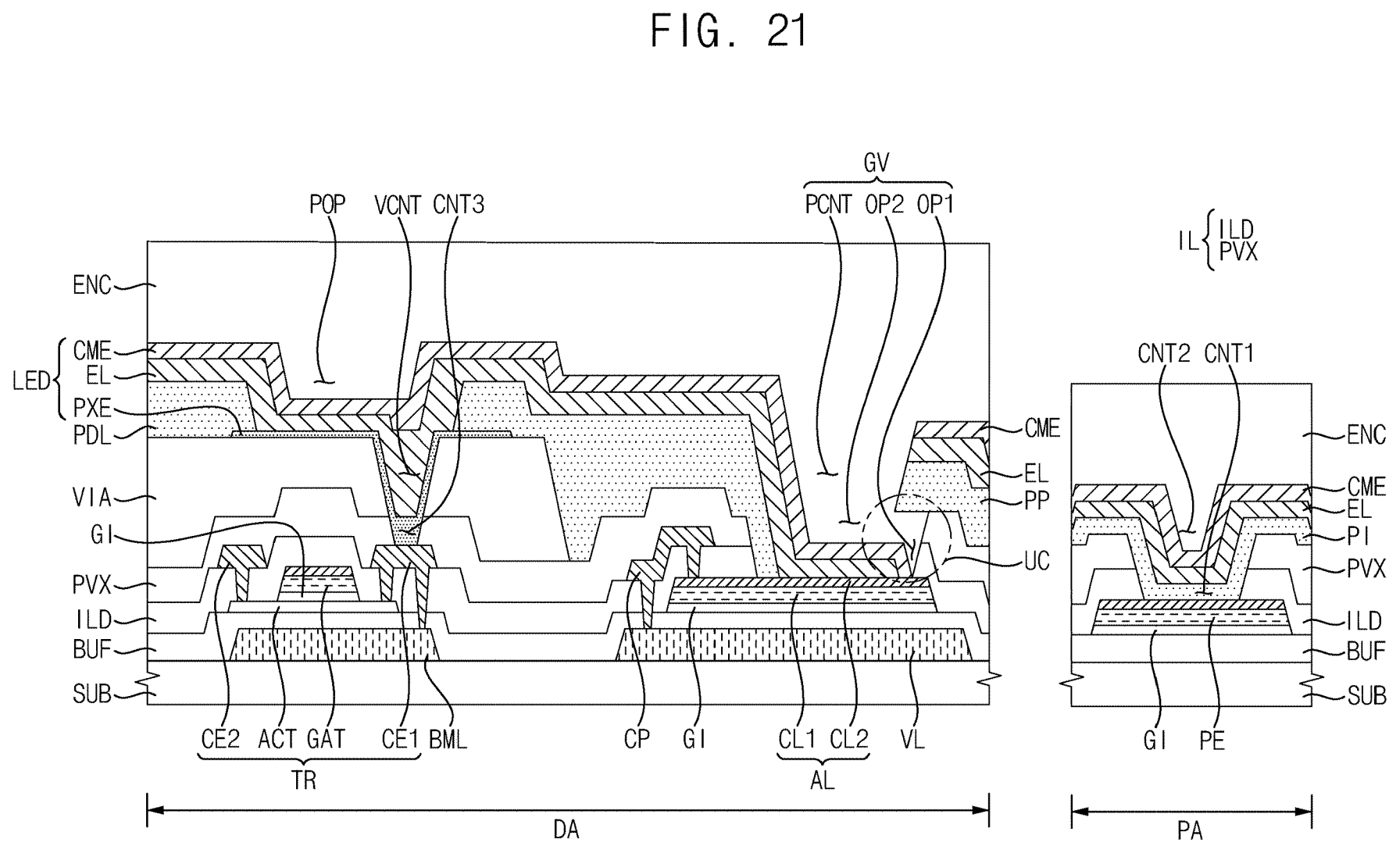

Referring to FIGS. 21 and 22, the encapsulation layer ENC may be formed on the common electrode CME. The encapsulation layer ENC may be entirely formed in the display area DA and the pad area PA. For example, the encapsulation layer ENC may be formed to have a relatively thick thickness in the display area DA and to have a relatively thin thickness in the pad area PA.

In an embodiment, the encapsulation layer ENC may fill the inside of the undercut shape UC. Specifically, the encapsulation layer ENC may fill the empty space of the groove GV.

After the encapsulation layer ENC is formed, parts of the light emitting layer EL, the common electrode CME, and the encapsulation layer ENC overlapping the pad area PA may be removed through a fourth etching process. In an embodiment, the fourth etching process may be a dry etching process.

After parts of the light emitting layer EL, the common electrode CME, and the encapsulation layer ENC overlapping the pad area PA are removed through the fourth etching process, the protective insulating layer PI may be removed. For example, the protective insulating layer PI may be removed through an ashing process.

Accordingly, the display device 100 illustrated in FIGS. 4 and 5 may be manufactured.

Figure 23:
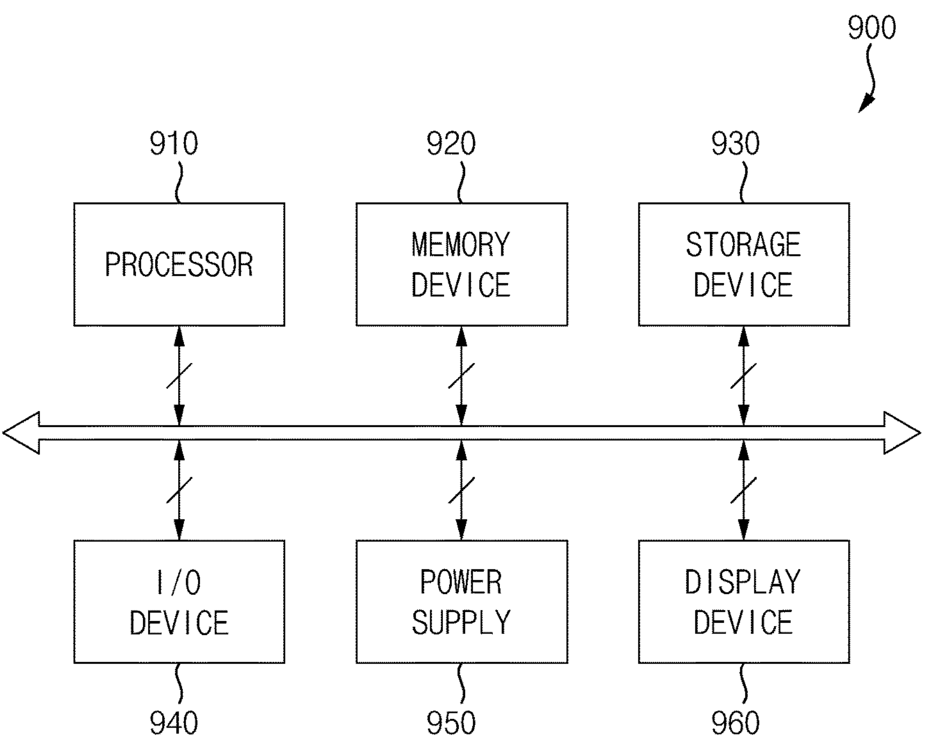
FIG. 23 is a block view illustrating an electronic device including the display device of FIG. 1.
Figure 24:
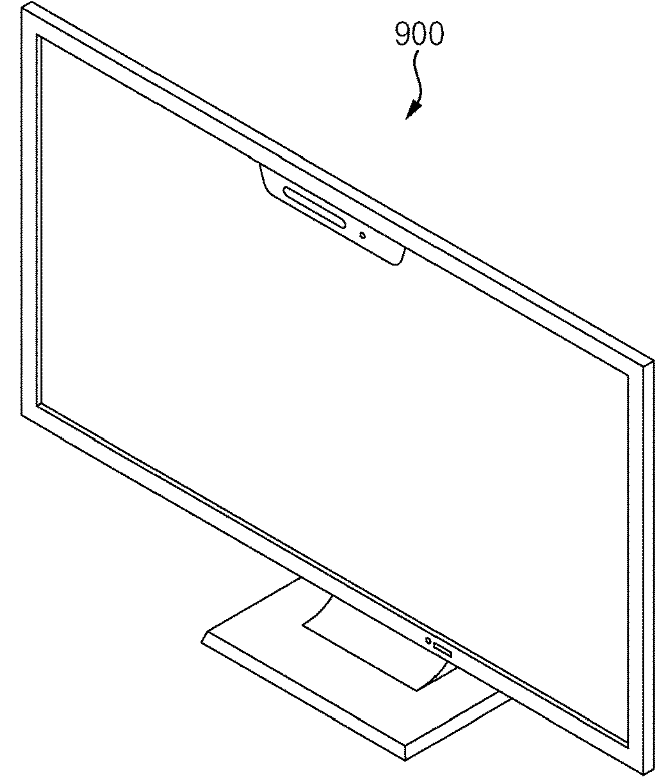
FIG. 24 is a view illustrating an example in which the electronic device of FIG. 23 is implemented as a television.

FIG. 23 is a block view illustrating an electronic device including the display device of FIG. 1. FIG. 24 is a view illustrating an example in which the electronic device of FIG. 23 is implemented as a television.

Referring to FIGS. 23 and 24, in an embodiment, the electronic device 900 may include a processor 910, a memory device 920, a storage device 930, an input/output ("I/O") device 940, a power supply 950 and a display device 960. In this case, the display device 960 may correspond to the display devices 100 described with reference to FIGS. 1, 2, 3, 4, 5, and 6. The electronic device 900 may further include various ports capable of communicating with a video card, a sound card, a memory card, a USB device, and the like.

In an embodiment, as illustrated in FIG. 24, the electronic device 900 may be implemented as a television. However, embodiments are not limited thereto, in another embodiment, the electronic device 900 may be implemented as a cellular phone, a video phone, a smart pad, a smart watch, a tablet personal computer ("PC"), a car navigation system, a computer monitor, a laptop, a head disposed (e.g., mounted) display ("HMD"), or the like.

The processor 910 may perform various computing functions. In an embodiment, the processor 910 may be a microprocessor, a central processing unit ("CPU"), an application processor ("AP"), or the like. The processor 910 may be coupled to other components via an address bus, a control bus, a data bus, or the like. The processor 910 may be coupled to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

The storage device 930 may include a solid state drive ("SSD") device, a hard disk drive ("HDD") device, a CD-ROM device, or the like.

The I/O device 940 may include an input device such as a keyboard, a keypad, a mouse device, a touchpad, a touch-screen, or the like, and an output device such as a printer, a speaker, or the like.

The power supply 950 may provide power for operations of the electronic device 900. The display device 960 may be coupled to other components via the buses or other communication links. In an embodiment, the display device 960 may be included in the I/O device 940.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:

an auxiliary power line disposed in a display area on a substrate;

a first inorganic insulating layer disposed on the auxiliary power line and defining a first opening extending to at least part of an upper surface of the auxiliary power line;

a second inorganic insulating layer disposed on the first inorganic insulating layer and defining a second opening connected to the first opening;

a pixel defining layer disposed on the second inorganic insulating layer, and defining a pixel contact hole connected to the first and second openings, an end of the pixel defining layer including a protrusion protruding toward a center of the pixel contact hole; and a common electrode disposed on the pixel defining layer and electrically connected to the auxiliary power line.

2. The display device of claim 1, wherein the protrusion defines an undercut shape together with first sides of the first and second openings, and the pixel defining layer extends into the first and second openings to cover second side surfaces of the first and second openings facing the first side surfaces.

3. The display device of claim 1, further comprising:

a light emitting layer disposed on the pixel defining layer and the auxiliary power line, wherein the light emitting layer is disconnected by the protrusion.

4. The display device of claim 3, wherein a sum of a thickness of the first inorganic insulating layer and a thickness of the second inorganic insulating layer is greater than or equal to a thickness of the light emitting layer.

5. The display device of claim 1, further comprising:

a transistor disposed in the display area on the substrate and including:

an active pattern disposed in the display area on the substrate;

a gate electrode disposed on the active pattern;

a first electrode disposed on the first inorganic layer and connected to the active pattern; and a second electrode disposed on the first inorganic layer and connected to the active pattern and disposed in a same layer with the first electrode; and a pad electrode disposed in a pad area positioned in one side of the display area.

6. The display device of claim 5, wherein the auxiliary power line includes a same material as the pad electrode.

7. The display device of claim 5, wherein the auxiliary power line and the pad electrode include a same material as the gate electrode.

8. The display device of claim 1, wherein the first and second inorganic insulating layers include a same silicon compound.

9. The display device of claim 1, wherein the first and second inorganic insulating layers include different silicon compound.

10. The display device of claim 1, wherein the auxiliary power line includes:

a first conductive layer; and a second conductive layer disposed on the first conductive layer, wherein the first conductive layer includes at least one material selected from a group consisting of titanium (Ti), copper (Cu), and aluminum (Al) and the second conductive layer includes a transparent conductive material.

11. The display device of claim 1, wherein the pixel defining layer includes an organic material.

12. The display device of claim 1, wherein a first inclination angle formed between a first side surface of the first opening and an upper surface of the auxiliary power line is different from a second inclination angle formed between a first side surface of the second opening and the upper surface of the auxiliary power line.

13. The display device of claim 12, wherein the second inclination angle is greater than the first second inclination angle.

14. The display device of claim 1, wherein a length of the protrusion toward the center of the pixel contact hole is about 0.1 micrometers (um) to about 0.5 micrometers (um).

15. The display device of claim 1, wherein the common electrode directly contacts at least part of an upper surface of the auxiliary power line.

16. A method for manufacturing a display device, the method comprising:

forming an auxiliary power line in a display area of a substrate;

forming a first preliminary inorganic insulating layer on the auxiliary power line;

forming a second preliminary inorganic insulating layer on the first preliminary inorganic insulating layer;

simultaneously forming a first inorganic insulating layer defining a first preliminary opening exposing at least a part of an upper surface of the auxiliary power line and a second inorganic insulating layer defining a second preliminary opening connected to the first preliminary opening by removing parts of the first and second preliminary inorganic insulating layers in the display area;

forming a pixel defining layer defining a pixel contact hole connected to the first and second preliminary openings on the second inorganic insulating layer;

removing parts of the first and second inorganic insulating layers overlapping the auxiliary power line and the pixel defining layer and exposed from the pixel defining layer so that an end of the pixel defining layer includes a protrusion protruding toward a center of the pixel contact hole; and forming a common electrode electrically connected to the auxiliary power line on the pixel defining layer.

17. The method of claim 16, wherein in the removing of the parts of the first and second inorganic insulating layers, the parts of the first and second inorganic insulating layers are removed through a wet etching process.

18. The method of claim 16, wherein the first preliminary opening is expanded to form a first opening, the second preliminary opening is expanded to form a second opening, and the protrusion forms an undercut shape together with first side surfaces of the first and second openings after the removing the parts of the first and second inorganic insulating layers.

19. The method of claim 16, further comprising:

forming a pad electrode in a pad area positioned in one side of the display area on the substrate, wherein the auxiliary power line is simultaneously formed through a same process as the pad electrode.

20. The method of claim 19, wherein the forming the pixel defining layer includes:

forming a preliminary pixel defining layer on the second inorganic insulating layer to fill the first and second preliminary openings;

simultaneously forming the pixel defining layer in the display area and a protective insulating layer in contact with the pad electrode in the pad area by selectively exposing and developing the preliminary pixel defining layer through a halftone mask; and removing the protective insulating layer after the forming the common electrode.

* * * * *